(12) United States Patent
Sasaki

(10) Patent No.: US 7,157,320 B2
(45) Date of Patent: Jan. 2, 2007

(54) SEMICONDUCTOR DEVICE AND PROCESS OF PRODUCTION OF SAME

(75) Inventor: Yuji Sasaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 180 days.

(21) Appl. No.: 10/816,307

(22) Filed: Apr. 1, 2004

(65) Prior Publication Data

US 2004/0185612 A1 Sep. 23, 2004

Related U.S. Application Data

(62) Division of application No. 09/899,331, filed on Jul. 5, 2001, now Pat. No. 6,744,115.

(30) Foreign Application Priority Data

Jul. 5, 2000 (JP) .............................. 2000-203982

(51) Int. Cl.
- *H01L 21/338* (2006.01)
- *H01L 21/337* (2006.01)
- *H01L 21/8238* (2006.01)
- *H01L 21/331* (2006.01)
- *H01L 21/8222* (2006.01)

(52) U.S. Cl. ...................... 438/170; 438/189; 438/202; 438/309; 438/378

(58) Field of Classification Search ..................... None
See application file for complete search history.

(56) References Cited

U.S. PATENT DOCUMENTS

| 4,795,722 | A | 1/1989 | Welch et al. |
| 4,807,016 | A | 2/1989 | Douglas |
| 5,118,634 | A | 6/1992 | Neudeck |
| 5,164,337 | A | 11/1992 | Ogawa et al. |
| 5,321,301 | A | 6/1994 | Sato |
| 5,966,609 | A | 10/1999 | Kwon |
| 6,268,297 | B1 * | 7/2001 | Nag et al. .................... 438/783 |
| 6,327,006 | B1 | 12/2001 | Sato et al. |
| 6,480,244 | B1 | 11/2002 | Murade et al. |
| 2002/0000659 | A1 | 1/2002 | Toyosawa et al. |
| 2002/0093019 | A1 | 7/2002 | Hirabayashi et al. |

* cited by examiner

*Primary Examiner*—David E. Graybill
(74) *Attorney, Agent, or Firm*—Robert J. Depke; Rockey, Depke, Lyons & Kitzinger LLC

(57) ABSTRACT

A semiconductor device comprising: a first insulating film formed on a semiconductor substrate; a semiconductor layer at least a part of which is formed on the first insulating film; a second insulating film comprising a non-doped silicon oxide film and formed on the semiconductor layer; a third insulating film comprising a silicon oxide film containing at least phosphorus formed on the second insulating film; and a fourth insulating film comprising a non-doped silicon oxide film formed on the third insulating film.

9 Claims, 24 Drawing Sheets

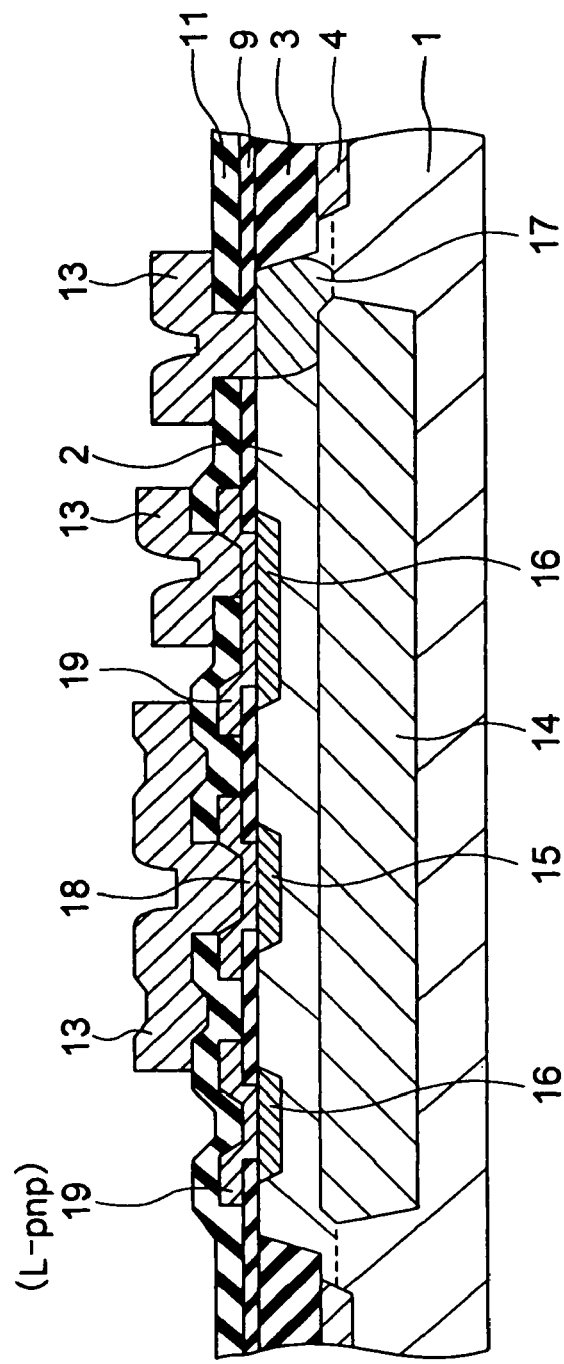
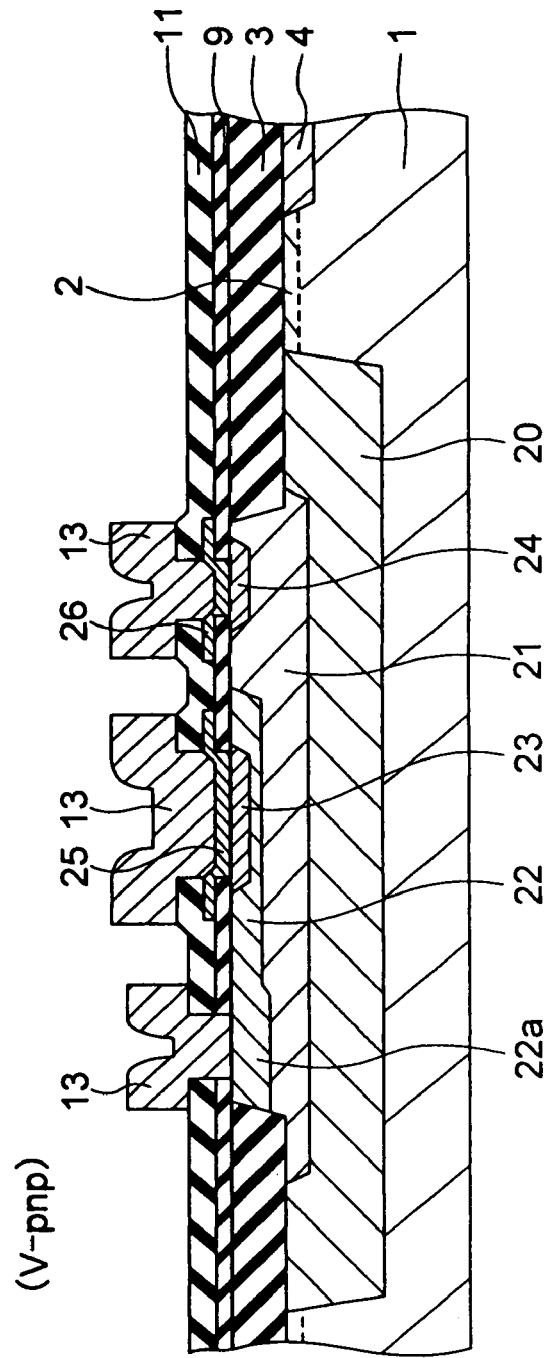

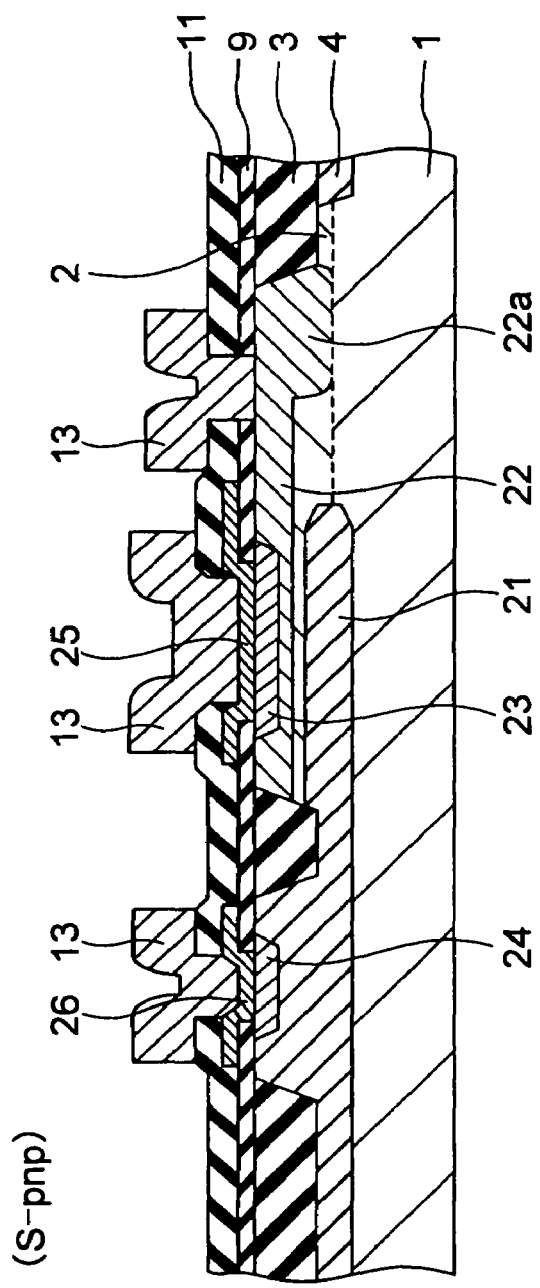
FIG. 3A (S-pnp)
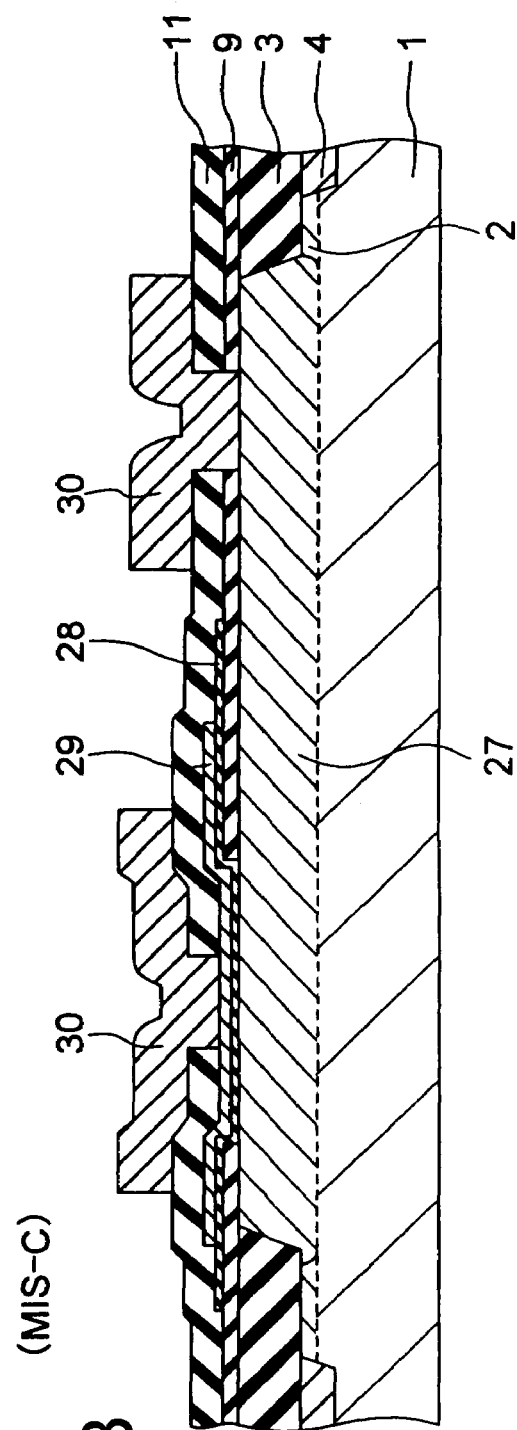
FIG. 3B (MIS-C)

(Poly-R)

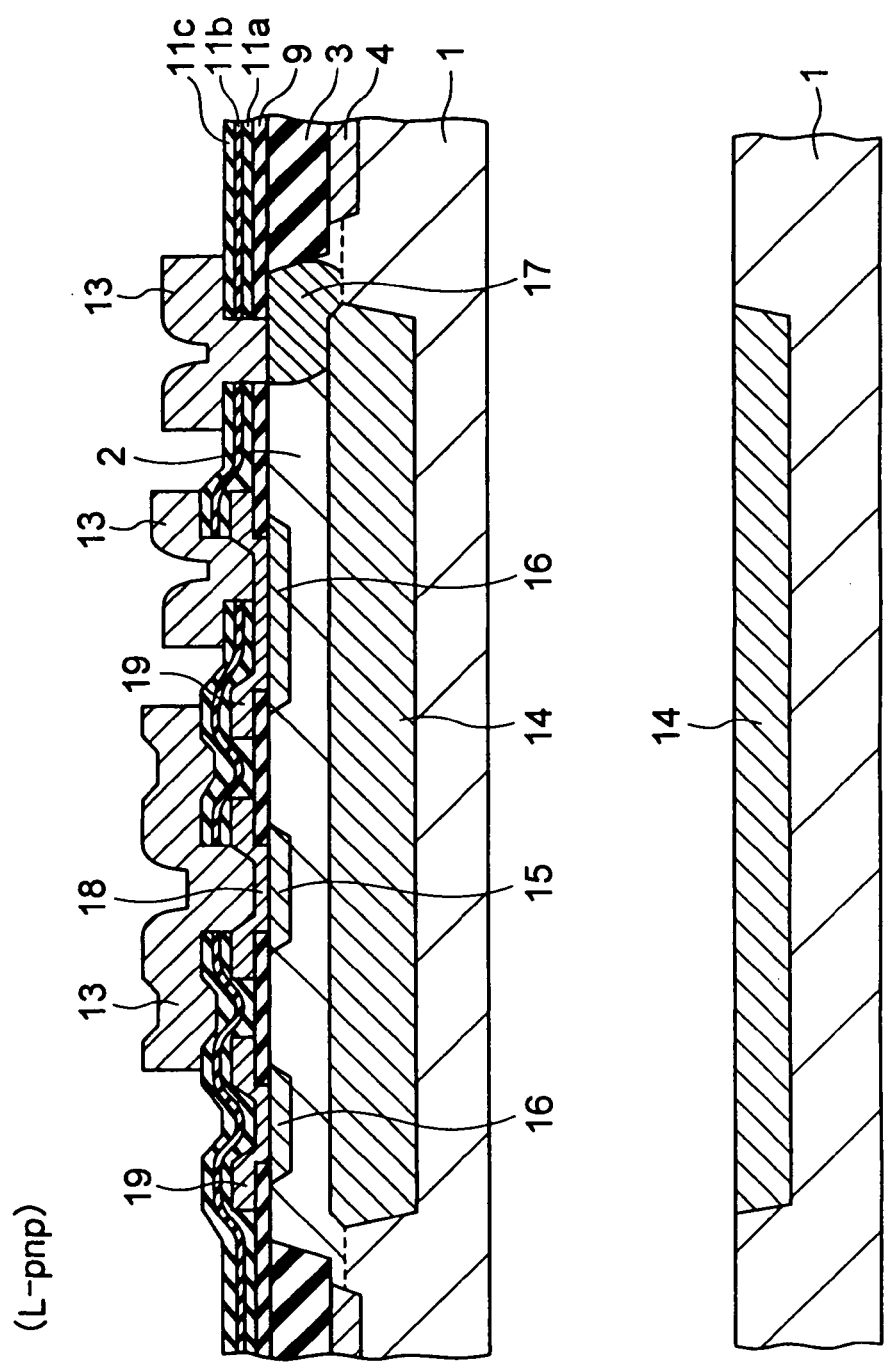

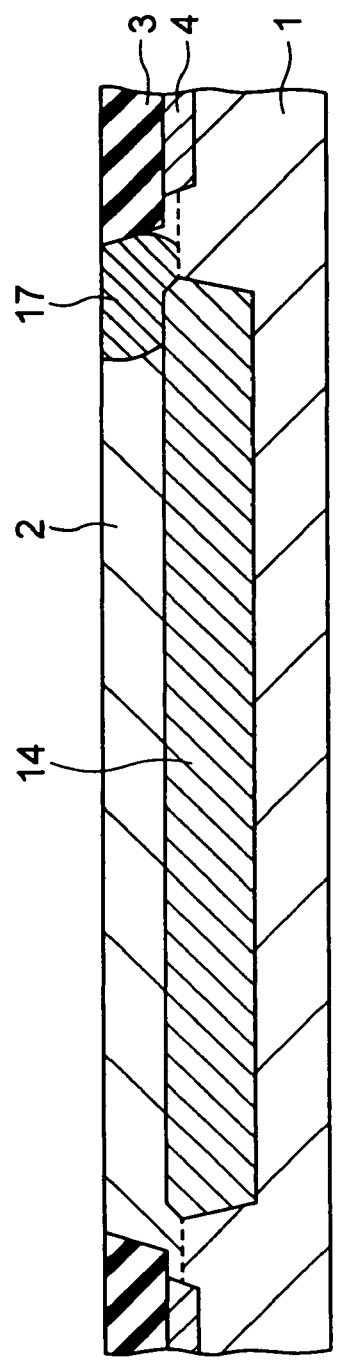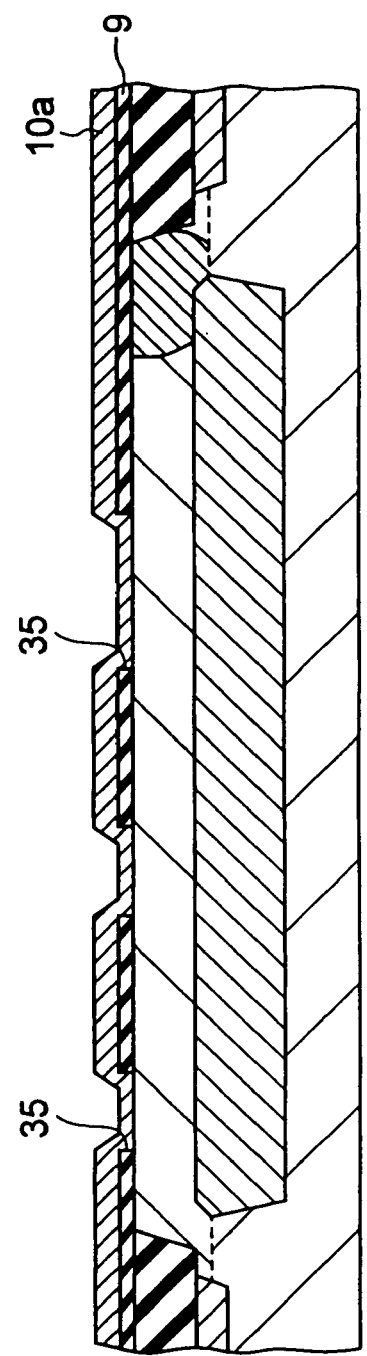
FIG. 12A
FIG. 12B

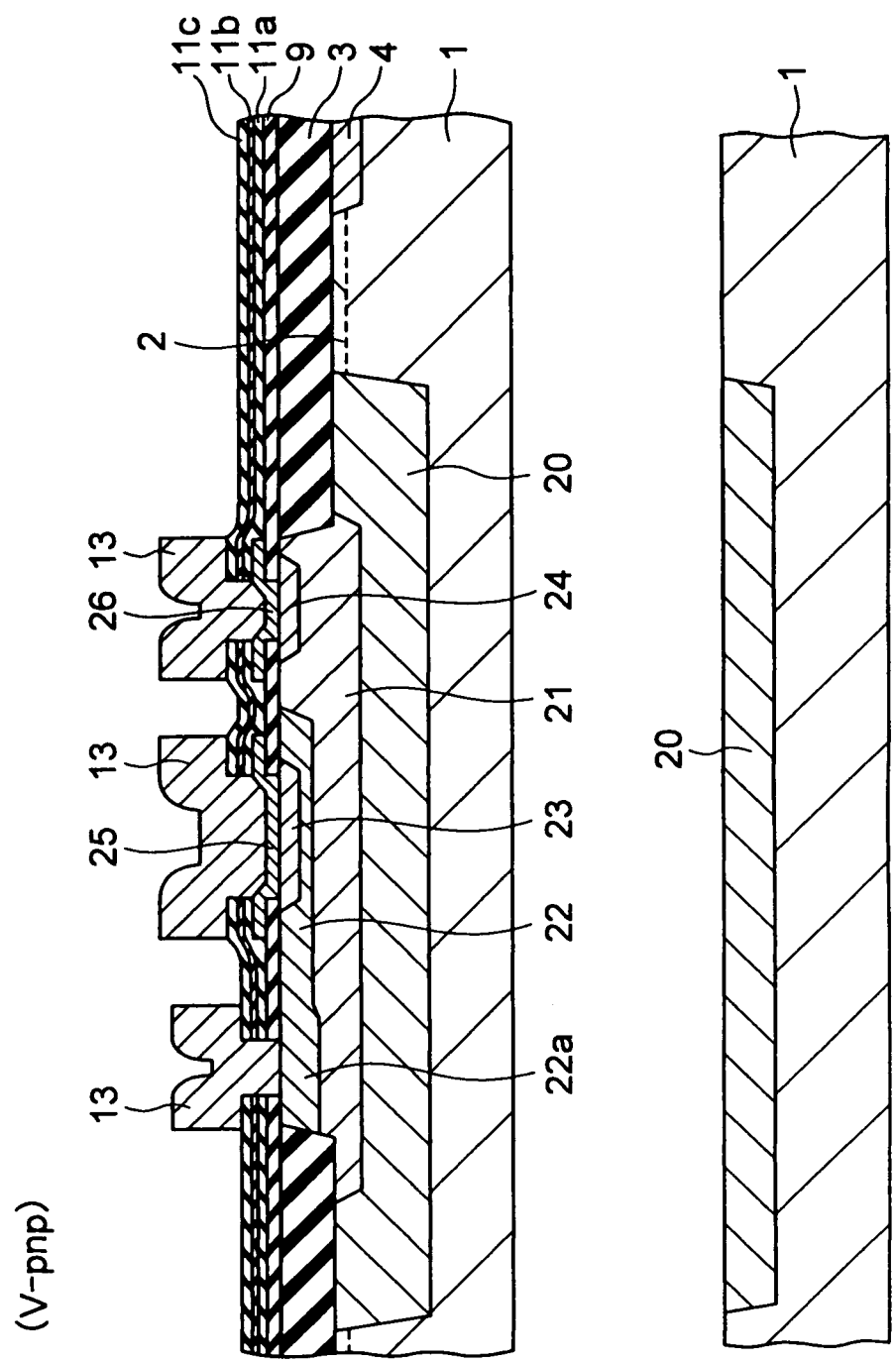

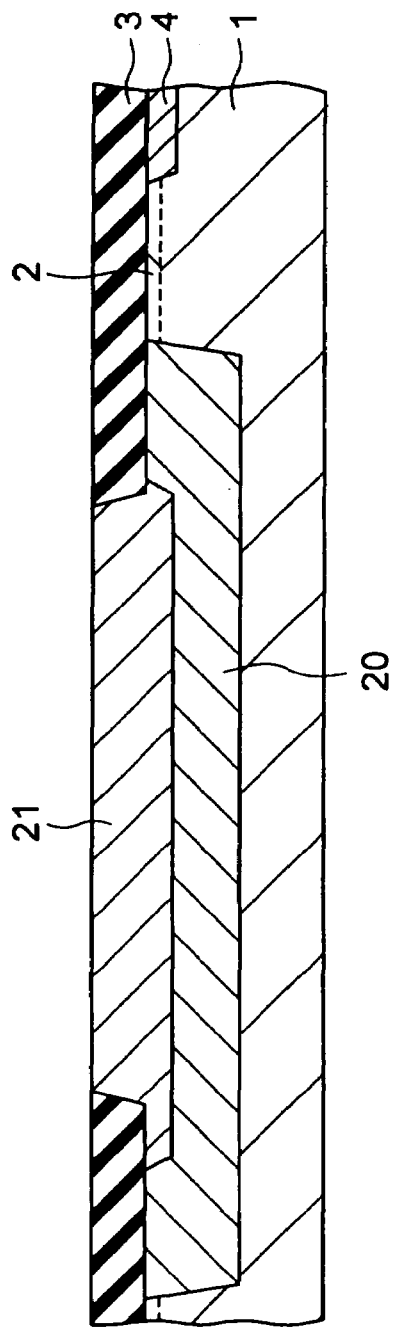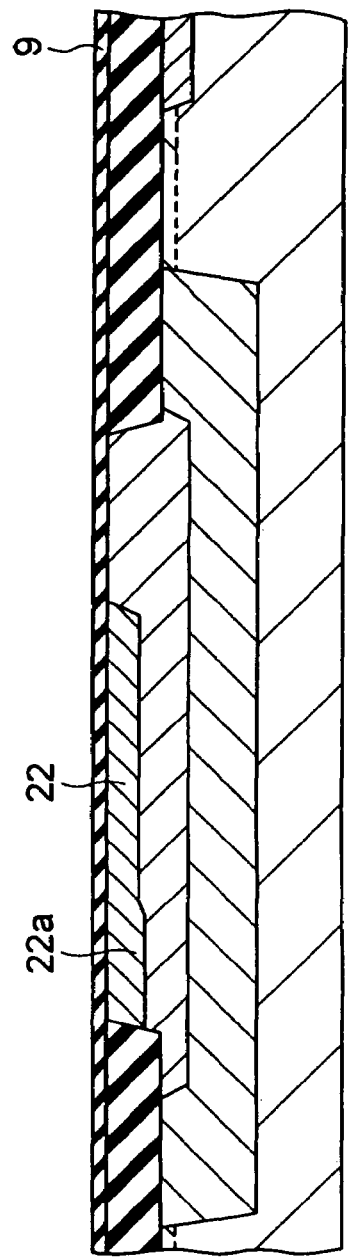
FIG. 15A
FIG. 15B

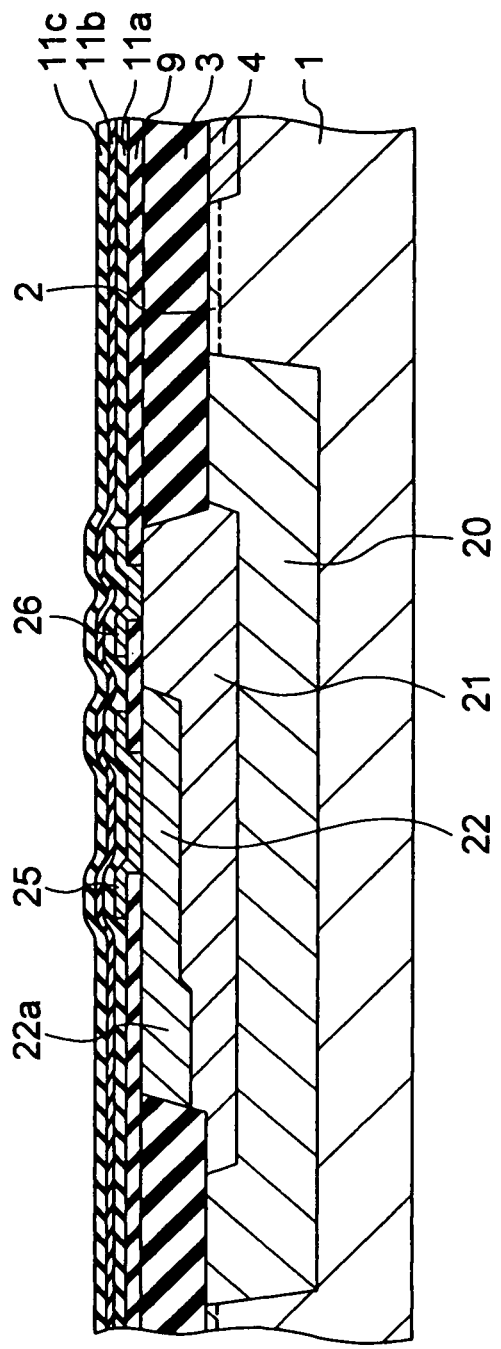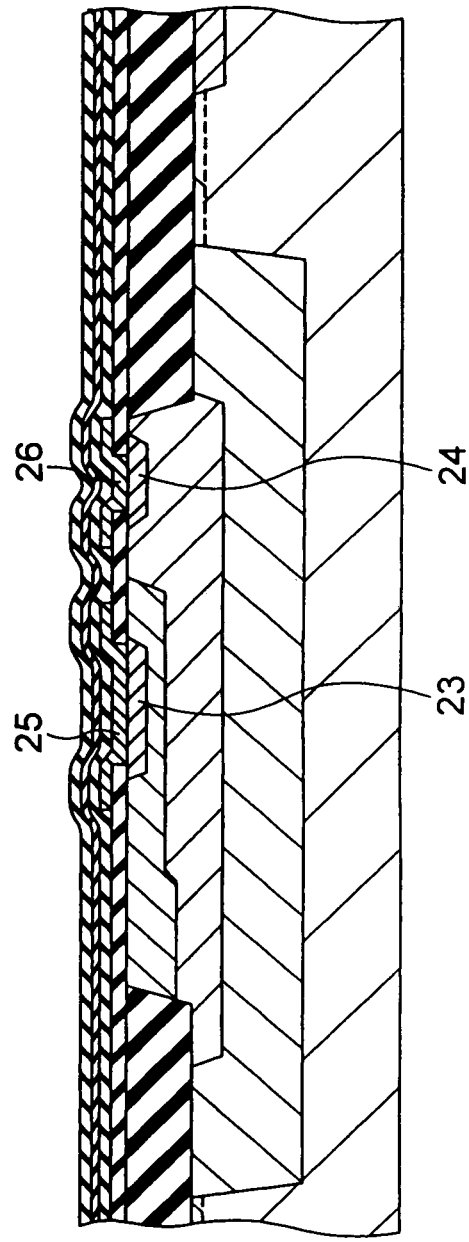
FIG. 17A
FIG. 17B

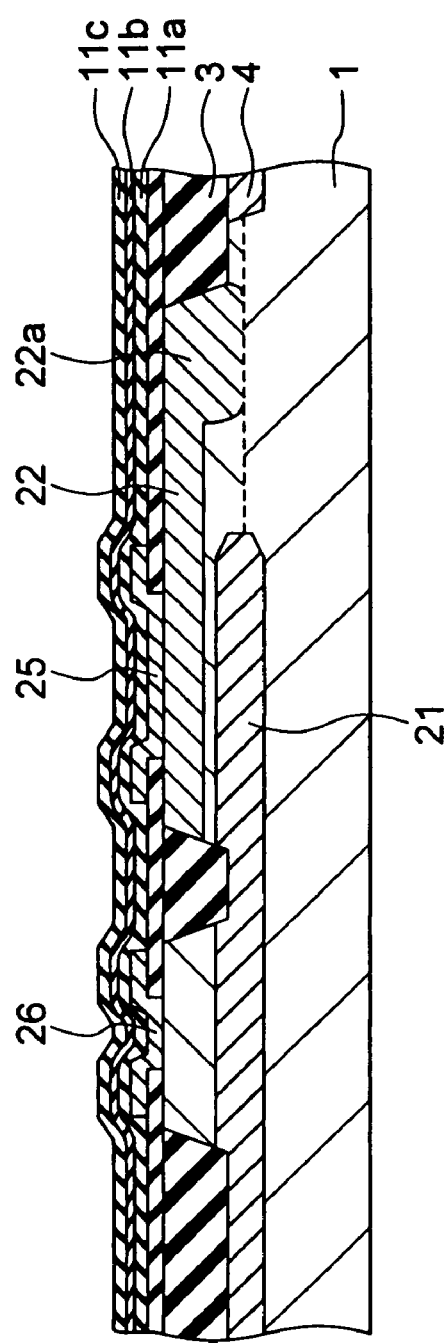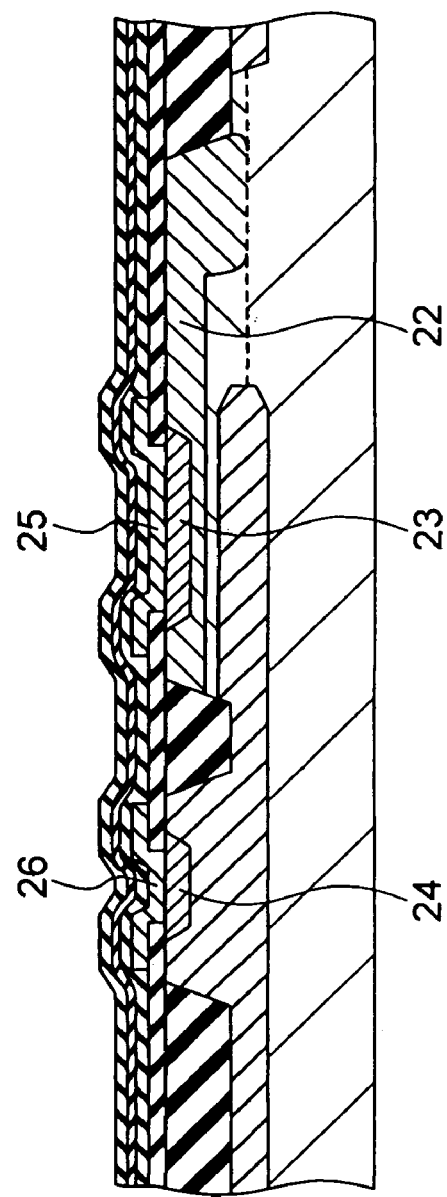
FIG. 20A
FIG. 20B

FIG. 21A (MIS-C)

SEMICONDUCTOR DEVICE AND PROCESS OF PRODUCTION OF SAME

The subject matter of application Ser. No. 09/899,331 is incorporated herein by reference. The present application is a divisional of U.S. application Ser. No. 09/899,331, filed Jul. 5, 2001 now U.S. Pat. No. 6,744,115, which claims priority to Japanese Patent Application No. JP2000-203982, filed Jul. 5, 2000. The present application claims priority to these previously filed applications.

BACKGROUND OF THE INVENTION

1. Field of the Invention

The present invention relates to a semiconductor device and a process of production of the same, more particularly a semiconductor device which prevents autodoping of an impurity from an insulating film to a conductive layer, especially to a polysilicon layer, to suppress fluctuations in characteristics and a process of production of the same.

2. Description of the Related Art

Various bipolar transistors, capacitors, or resistors are structured with a conductive layer comprised of for example polysilicon formed on a semiconductor substrate and with interconnections formed on them via an insulating film.

FIGS. 1 to 4 show examples of cross-sectional structures of these elements. Each element shown in FIGS. 1 to 4 is formed on a p-type semiconductor substrate 1 and an n-type epitaxial layer 2 formed on the substrate 1. In all the elements of FIGS. 1 to 4, a LOCOS 3 for separating elements is formed on the surface of the n-type epitaxial layer 2. Below the LOCOS 3 is formed an element separating diffusion layer 4. The element separating diffusion layer 4 reaches the p-type semiconductor substrate.

FIG. 1 shows a vertical npn transistor (below, referred to as an "V-npn"), while FIG. 2A shows a lateral pnp transistor (below, referred to as an "L-pnp")

FIG. 2B and FIG. 3A both show vertical pnp transistors. FIG. 2B shows a vertical pnp transistor comprising an n-type buried layer which separates electrically a p-type collector layer and the p-type semiconductor substrate. This is referred to as a "V-pnp" below. On the other hand, FIG. 3A shows a vertical pnp transistor wherein a p-type collector layer is formed to reach a p-type semiconductor substrate (substrate pnp). This is referred to as an "S-pnp" below.

FIG. 3B shows a capacitor of a metal-insulator-semiconductor (MIS) structure (below, referred to as an "MIS-C"), while FIG. 4 shows a polysilicon resistor (below, referred to as a "Poly-R").

Below, the structure of each element mentioned above will be explained.

The V-npn of FIG. 1 has an n-type collector buried layer 5 at the surface layer of the p-type. semiconductor substrate 1. The n-type epitaxial layer 2 above it is made an n-type collector layer. At the surface layer of the n-type epitaxial layer 2 comprised of the n-type collector layer is formed a p-type base region 6. Around the p-type base region 6 is formed a graft base 6a. At the surface layer of the p-type base region 6 is formed an n-type emitter region 7. Also, at the n-type epitaxial layer 2 is formed a collector plug region (n⁺ sinker) 8 which connects to the n-type collector buried layer 5.

On the n-type epitaxial layer 2 or the LOCOS 3 is formed for example a silicon oxide film 9 as a first insulating film. The silicon oxide film 9 on the p-type base region 6 is provided with an opening. In the opening and on the silicon oxide film 9 around the opening is formed a first polysilicon layer (p-type base electrode 10) which is connected to the p-type base region 6 and serves as a base take-out part. The p-type base electrode 10 on the n-type emitter region 7 is provided with an opening.

On the p-type base electrode 10 or the silicon oxide film 9 is formed for example a silicon oxide film 11 as a second insulating film. The silicon oxide film 11 on the n-type emitter region 7 is provided with an opening. In the opening and on the silicon oxide film 11 around the opening is formed an n-type emitter polysilicon layer 12. The n-type emitter polysilicon layer 12 connects to the n-type emitter region 7 and serves as an emitter take-out part.

On a part of the p-type base electrode 10, on the n-type emitter polysilicon 12 and on the collector plug region 8 are formed electrodes 13.

Next, as shown in FIG. 2A, the L-pnp has an n-type base buried layer 14 at the surface layer of the p-type semiconductor substrate. The n-type epitaxial layer 2 on the n-type base buried layer 14 becomes an n-type base layer. At the surface layer of the n-type epitaxial layer comprised of the n-type base layer are formed a p-type emitter region 15 and a p-type collector region 16 separate from each other. Also, in the n-type epitaxial layer 2 is formed a base plug region (n⁺ sinker) 17 connected to the n-type base buried layer 14.

On the n-type epitaxial layer 2 or the LOCOS 3 is formed for example a silicon oxide film 9 as a first insulating film. The silicon oxide film 9 on the p-type emitter region 15 and the p-type collector region 16 are provided with openings. At the opening on the p-type emitter region 15 is formed an emitter take-out electrode 18 comprised of a p-type polysilicon layer. In the same way, at the opening on the p-type collector region 16 is formed a collector take-out electrode 19 comprised of a p-type polysilicon layer.

Electrodes 13 are formed on each of the emitter take-out electrode 18, collector take-out electrode 19, and base plug region 17.

As shown in FIG. 2B, the V-pnp has an n-type buried layer 20 at the surface layer of the p-type semiconductor substrate 1 on which a p-well comprised of a p-type collector region 21 is formed. Due to the n-type buried layer 20, the p-type collector region 21 and the p-type semiconductor substrate 1 are separated electrically. At the surface layer of the p-type collector region 21 are formed an n-type base region 22 and a graft base 22a connected to the base region 22. At the surface layer of the n-type base region 22 is formed a p-type emitter region 23. Also, the surface layer of the p-type collector region 21 is formed with a collector take-out part 24 separate from the n-type base region 22 and graft base 22a. The collector take-out part 24 contains a p-type impurity at a higher concentration than the p-type collector region 21.

On the n-type epitaxial layer 2 or LOCOS 3 is formed for example a silicon oxide film 9 as a first insulating film. In the silicon oxide film 9 on the base take-out part, p-type emitter region 23, and collector take-out part 24 are formed openings. At the opening on the p-type emitter region 23 is formed an emitter take-out electrode 25 comprised of p-type polysilicon. In the same way, at the opening on the collector take-out part 24 is formed a collector take-out electrode 26 comprised of p-type polysilicon. Electrodes 13 are formed on the base take-out part, emitter take-out electrode 25, and collector take-out electrode 26.

As shown in FIG. 3A, the S-pnp has a p-type collector region 21 in the n-type epitaxial layer 2. A part of the p-type collector region 21 reaches the surface of the p-type semiconductor substrate 1. Also, in the n-type epitaxial layer 2 are formed an n-type base region 22 and a graft base 22a. A part of the n-type base region 22 is formed on the p-type collector region 21. At the surface layer of the n-type base region 22 on the p-type collector region 21 is formed a p-type emitter region 23. Also, at the surface layer of the p-type collector region 21 is formed a collector take-out part 24. The collector take-out part 24 contains a p-type impurity at a higher concentration than the p-type collector region 21.

On the n-type epitaxial layer 2 or LOCOS 3 is formed for example a silicon oxide film 9 as a first insulating film. In the same way as the V-pnp shown in FIG. 2B, the silicon oxide film 9 on the base take-out part, p-type emitter region 23, and collector take-out part 24 are provided with openings. At the opening on the p-type emitter region 23 is formed an emitter take-out electrode 25 comprised of p-type polysilicon. In the same way, at the opening on the collector take-out part 24 is formed a collector take-out electrode 26 comprised of p-type polysilicon. Electrodes 13 are formed on the base take-out part, emitter take-out electrode 25, and collector take-out electrode 26.

As shown in FIG. 3B, the MIS-C has in the n-type epitaxial layer 2 a lower electrode layer 27 wherein an n-type impurity is diffused. On the n-type epitaxial layer 2 or LOCOS 3 is formed for example a silicon oxide film 9 as a first insulating film. In an opening formed in the silicon oxide film 9 on the lower electrode layer 27 and on the silicon oxide film 9 around the opening is formed a capacitor dielectric layer 28 comprised of for example a silicon nitride film.

On the capacitor dielectric layer 28 is formed an upper electrode 29 comprised of a p-type polysilicon layer. The upper electrode 29 is covered with a silicon oxide film 11 comprised of a second insulating film. The silicon oxide film 11 on the upper electrode 29 is formed with an opening. In the opening are formed an interconnection connected to the upper electrode 29. Also, the interconnection 30 connected to the lower electrode layer 27 is formed on the lower electrode layer 27 except for a part where the capacitor dielectric layer 28 and upper electrode 29 are formed.

As shown in FIG. 4, the Poly-R has a polysilicon resistor layer 31 on the LOCOS 3 via the silicon oxide film 9. The polysilicon resistor layer 31 contains an n-type impurity, and the polysilicon resistor layer 31 is covered with the silicon oxide film 11. In the silicon oxide film 11 on the polysilicon resistor layer 31 is formed an interconnection 30 connected to the polysilicon resistor layer 31.

In the above elements shown in FIGS. 1 to 4, on each layer comprised of polysilicon (the p-type base electrode 10 of FIG. 1, the emitter take-out electrode 18 and collector take-out electrode 19 of FIG. 2A, the emitter take-out electrode 25 and collector take-out electrode 26 of FIGS. 2B and 3A, the upper electrode 29 of FIG. 3B, and the polysilicon resistor layer 31 of FIG. 4) is formed a silicon oxide film 11.

As these silicon oxide film 11, a non-doped silicon oxide film (NSG; non-doped silicate glass) formed by chemical vapor deposition (CVD) is usually used. When NSG is used as the silicon oxide film 11, autodoping does not occur. Therefore, for example, when the NSG film is used as the silicon oxide film 11 in the V-npn shown in FIG. 1, it becomes possible to stabilize a base/emitter junction and form a shallow junction.

Also, each element shown in FIGS. 2 to 4 has a structure suitable for mixed mounting on the same substrate with the V-npn of a double polysilicon structure shown in FIG. 1. For example, a polysilicon layer and a silicon oxide film on it etc. can be formed by the same process between the elements.

In the elements shown in FIGS. 1 to 4, for the purpose of miniaturization of elements, all of the processing of the polysilicon layer or insulating film is conducted by reactive ion etching. (RIE). During the RIE, damage due to RIE is given to the surface of the semiconductor substrate or thermal oxide film and CVD insulating film to which reaction products of RIE stick.

Also, in photolithography for RIE, when unnecessary resist is removed, it is difficult to completely remove the resist residue strongly adhering to the semiconductor substrate or thermal oxide film and CVD insulating film.

These reaction products and strongly adhering resist residue diffuse or damage elements without diffusion due to heat treatment etc. in the production process. The extremely small amounts of mobile ions contained in the reaction products makes the surface conditions unstable and reduces the transistor characteristics. For example, in a reliability test of a junction of a bipolar transistor, the current amplification factor $h_{FE}$ decreases. Here, the reliability test of a junction is a test in which a certain amount of reverse bias is applied to the junction at a high temperature for a long time and deterioration is monitored.

Also, in capacitors and resistors, the presence of mobile ions makes the capacitance characteristics and resistance unstable.

SUMMARY OF THE INVENTION

An object of the present invention is to provide a semiconductor device which prevents changes of characteristics due to damage by etching and autodoping of impurities and has a high reliability.

Another object of the present invention is to provide a process of production of the above semiconductor device.

According to a first aspect of the present invention, there is provided a semiconductor device comprising a first insulating film formed on a semiconductor substrate; a semiconductor layer at least a part of which is formed on the first insulating film; a second insulating film comprised of a non-doped silicon oxide film and formed on the semiconductor layer; a third insulating film comprised of a silicon oxide film containing at least phosphorus formed on the second insulating film; and a fourth insulating film comprised of a non-doped silicon oxide film formed on the third insulating film.

Preferably, the third insulating film is comprised of a phosphosilicate glass (PSG) film.

Alternatively, the third insulating film is comprised of a borophosphosilicate glass (BPSG) film.

Preferably, the semiconductor layer is comprised of polysilicon.

Preferably, the semiconductor device further comprises a second conductivity type collector region formed at the surface layer of a first conductivity type semiconductor substrate; a first conductivity type base region formed at the surface layer of the second conductivity type collector region; a second conductivity type emitter region formed at the surface layer of the first conductivity type base region; a first opening formed at least on the second conductivity type emitter region in the first insulating film; a base electrode comprised of the semiconductor layer formed in the first opening and on the first insulating film around the first opening; a second opening formed in the base electrode and second, third, and fourth insulating films in the first opening; and an emitter take-out part comprised of a second semiconductor layer formed in the second opening and on the fourth insulating film around the second opening.

Preferably, the semiconductor device further comprises a second conductivity type base region formed at the surface layer of the first conductivity type semiconductor substrate; a first conductivity type collector region formed at the surface layer of the second conductivity type base region; a first conductivity type emitter region formed at the surface layer of the second base region separate from the first conductivity type collector region; a collector opening formed in the first insulating film on the first conductivity type collector region; an emitter opening in the first insulating film on the first conductivity type emitter region; a collector take-out electrode comprised of the semiconductor layer formed in the collector opening and on the first insulating film around the collector opening; an emitter take-out electrode comprised of the semiconductor layer formed in the emitter opening and on the first insulating film around the emitter opening; a contact hole formed in the first, second, third, and fourth insulating films formed on the second conductivity type base region; and a base electrode formed at the contact hole.

Preferably, the semiconductor device further comprises a second conductivity type impurity diffusion layer formed at the surface layer of the first conductivity type semiconductor substrate; a first conductivity type collector region formed at the surface layer of the second conductivity type impurity diffusion layer; a second conductivity type base region formed at the surface layer of the first conductivity type collector region; a first conductivity type emitter region formed at the surface layer of the second conductivity type base region; a collector opening formed in the first insulating film on the first conductivity type collector region; an emitter opening formed in the first insulating film on the first conductivity type emitter region; a collector take-out electrode comprised of the semiconductor layer formed in the collector opening and on the first insulating film around the collector opening; an emitter take-out electrode comprised of the semiconductor layer formed in the emitter opening and on the first insulating film around the emitter opening; a contact hole formed in the first, second, third, and fourth insulating films on the second conductivity type base region; and a base electrode formed at the contact hole.

Preferably, the semiconductor device further comprises a first conductivity type collector region formed in the semiconductor substrate of the first conductivity type comprising a collector take-out part connected to the surface of the semiconductor substrate; a second conductivity type base region formed on the first conductivity type collector region except the collector take-out part; a second conductivity type base region formed on the first conductivity type collector region except the collector take-out part; a first conductivity type emitter region formed at the surface layer of the second conductivity type base region; a collector opening formed in the first insulating film on the collector take-out part; an emitter opening formed in the first insulating film on the first conductivity type emitter region; a collector take-out electrode comprised of the semiconductor layer formed in the collector opening and on the first insulating film around the collector opening; an emitter take-out electrode comprised of the semiconductor layer formed in the emitter opening and on the first insulating film around the emitter opening; a contact hole formed in the first, second, third, and fourth insulating films on the second conductivity type base region; and a base electrode formed at the contact hole.

Preferably, the semiconductor device further comprises a lower electrode layer formed at the surface layer of the semiconductor substrate; an opening formed in the first insulating film on the lower electrode layer; a capacitor dielectric layer formed in the opening and on the first insulating film around the opening; an upper electrode comprised of the semiconductor layer and formed on the capacitor dielectric layer; a contact hole formed in the second, third, and fourth insulating films on the upper electrode; and an interconnection formed at the contact hole.

Preferably, the semiconductor device further comprises a resistor layer comprised of the semiconductor layer formed on the first insulating film; a contact hole formed in the second, third, and fourth insulating films on the resistor layer; and an interconnection formed at the contact hole.

Due to this, when etching in the production process of a semiconductor device, the third insulating film comprised of the PSG film or BPSG film etc. becomes a buffering part to damage and prevents damage to an element due to the etching. Also, it is possible not only to perform gettering of impurities by the third insulating film but to prevent autodoping from the third insulating film by the second and fourth insulating films.

Therefore, for example, in a bipolar transistor, it becomes possible to make a base/emitter junction stable and form a shallow junction. Alternatively, in a capacitor, it becomes possible to make the capacitance characteristics stable. In a resistor, it becomes possible to make the resistance stable. Also, the reliability of a semiconductor device including these elements can be improved.

According to a second aspect of the present invention, there is provided a process of production of a semiconductor device comprising the steps of forming a first insulating film on a semiconductor substrate; forming a semiconductor layer on the first insulating film; forming a second insulating film comprised of a non-doped silicon oxide film on the semiconductor layer; forming a third insulating film comprised of a silicon oxide film containing at least phosphorus on the second insulating film; and forming a fourth insulating film comprised of a non-doped silicon oxide film on the third insulating film.

Preferably, the step of forming the second, third, and fourth insulating films comprises three different chemical vapor deposition (CVD) steps.

Alternatively, the step of forming the second, third, and fourth insulating films comprises a continuous chemical vapor deposition process where an amount of supply of phosphorus is changed before and after the step of forming the third insulating film.

Preferably, the process of production of a semiconductor device further comprises the steps of forming a second conductivity type collector region at the surface layer of the semiconductor substrate of the first conductivity type; forming a first conductivity type base region at the surface layer of the second conductivity type collector region; forming the first insulating film on the semiconductor substrate and forming a first opening in the first insulating film; forming a base electrode comprised of the semiconductor layer in the first opening and on the first insulating film around the first opening; forming the second, third, and fourth insulating films on the base electrode and the first insulating film around the base electrode; forming a second opening in the base electrode and the second, third, and fourth insulating film in the first opening; forming an emitter take-out part comprised of a second semiconductor layer in the second opening and on the fourth insulating film around the second opening; and diffusing an impurity from the emitter take-out part and forming a second conductivity type emitter region at the surface layer of the first conductivity type base region.

Preferably, the process of production of a semiconductor device further comprises the steps of forming a second conductivity type base region at the surface layer of the semiconductor substrate of the first conductivity type; forming the first insulating film on the semiconductor substrate and forming a collector opening and emitter opening in the first insulating film; forming the semiconductor layer in the collector opening and emitter opening and on the first insulating film; etching the semiconductor layer and forming a collector take-out electrode comprised of the semiconductor layer in the collector opening and on the first insulating film around the collector opening; forming by the etching an emitter take-out electrode comprised of the semiconductor layer in the emitter opening and on the first insulating film around the emitter opening; forming the second, third, and fourth insulating films on the collector take-out electrode, emitter take-out electrode, and the first insulating film around the emitter take-out electrode and the collector take-out electrode; diffusing an impurity from the collector take-out electrode and forming a first conductivity type collector region at the surface layer of the second conductivity type base region; diffusing an impurity from the emitter take-out electrode and forming a first conductivity type emitter region at the surface layer of the second conductivity type base region; forming a contact hole in the first, second, third, and fourth insulating films on the second conductivity type base region; and forming a base electrode at the contact hole.

Preferably, the process of production of a semiconductor device further comprises the steps of forming a second conductivity type impurity diffusion layer at the surface layer of the semiconductor substrate of the first conductivity type; forming a first conductivity type collector region at the surface layer of the second conductivity type impurity diffusion layer; forming a second conductivity type base region at the surface layer of the first conductivity type collector region; forming the first insulating film on the semiconductor substrate; forming a collector opening in the first insulating film on the first conductivity type collector region and forming an emitter opening in the first insulating film on the second conductivity type base region; forming the semiconductor layer in the collector opening and emitter opening and on the first insulating film; forming a collector take-out electrode comprised of the semiconductor layer in the collector opening and on the first insulating film around the collector opening; forming an emitter take-out electrode comprised of the semiconductor layer in the emitter opening and on the first insulating film around the emitter opening; forming the second, third, and fourth insulating films on the collector take-out electrode, emitter take-out electrode, and first insulating film around the collector take-out electrode and emitter take-out electrode; diffusing an impurity from the collector take-out electrode and forming a collector take-out part at the surface layer of the first conductivity type collector region; diffusing an impurity from the emitter take-out electrode and forming a first conductivity type emitter region at the surface layer of the second conductivity type base region; forming a contact hole in the first, second, third, and fourth insulating films on the second conductivity type base region; and forming a base electrode at the contact hole.

Preferably, the process of production of a semiconductor device further comprises the steps of forming a first conductivity type collector region in the semiconductor substrate of the first conductivity type; forming a second conductivity type base region in a part of the semiconductor substrate on the first conductivity type collector region; forming the first insulating film on the semiconductor substrate; forming a collector opening in the first insulating film on the first conductivity type collector region and forming an emitter opening in the first insulating film on the second conductivity type base region; forming the semiconductor layer in the collector opening and emitter opening and on the first insulating film; forming a collector take-out electrode comprised of the semiconductor layer in the collector opening and on the first insulating film around the collector opening; forming an emitter take-out electrode comprised of the semiconductor layer in the emitter opening and on the first insulating film around the emitter opening; forming the second, third, and fourth insulating films on the collector take-out electrode, emitter take-out electrode, and first insulating film around the collector take-out electrode and emitter take-out electrode; diffusing an impurity from the collector take-out electrode to form a collector take-out part at the surface layer of the first conductivity type collector region; diffusing an impurity from the emitter take-out electrode to form a first conductivity type emitter region at the surface layer of the second conductivity type base region; forming a contact hole in the first, second, third, and fourth insulating films on the second conductivity type base region; and forming a base electrode at the contact hole.

Preferably, the process of production of a semiconductor device further comprises the steps of forming a lower electrode layer at the surface layer of the semiconductor substrate; forming the first insulating film on the semiconductor substrate and forming an opening in the first insulating film on the lower electrode layer; forming a capacitor dielectric layer in the opening and on the first insulating film around the opening; forming an upper electrode comprised of the semiconductor layer on the capacitor dielectric layer; forming the second, third, and fourth insulating films on the upper electrode and first insulating film around the upper electrode; forming a contact hole in the second, third, and fourth insulating films on the upper electrode; and forming an interconnection at the contact hole.

Preferably, the process of production of a semiconductor device further comprises the steps of, after forming the semiconductor layer on the first insulating film, diffusing an impurity to the semiconductor layer; etching the semiconductor layer and forming a resistor layer comprised of the semiconductor layer; forming the second, third, and fourth insulating films on the resistor layer and the insulating film around the resistor layer; forming a contact hole in the second, third, and fourth insulating films on the resistor layer; and forming an interconnection at the contact hole.

Due to this, when etching in the production process of a semiconductor device, it becomes possible to prevent damage to elements using the third insulating film comprised of the PSG film or BPSG film as a buffering part to damage. Also, since the third insulating film having an impurity gettering ability is formed between the second insulating film and the fourth insulating film, it becomes possible to prevent autodoping from the third insulating film.

BRIEF DESCRIPTION OF THE DRAWINGS

These and other objects and features of the present invention will become clearer from the following description of the preferred embodiments given with reference to the accompanying drawings, in which:

FIG. 2A is a cross-sectional view of an example of a lateral pnp transistor as a semiconductor device of the related art, while FIG. 2B is a cross-sectional view of an example of a vertical pnp transistor as a semiconductor device of the related art;

FIG. 3A is a cross-sectional view of an example of a vertical pnp transistor as a semiconductor device of the related art, while FIG. 3B is a cross-sectional view of an example of a MIS capacitor as a semiconductor device of the related art;

FIG. 5A is a cross-sectional view of an example of vertical npn transistor as a semiconductor device of a first embodiment of the present invention, while

FIG. 11A is a cross-sectional view of an example of a lateral pnp transistor as a semiconductor device of a second embodiment of the present invention, while FIG. 11B is a cross-sectional view of a step of the process of production of a semiconductor device of the second embodiment of the present invention;

FIGS. 12A and 12B are cross-sectional views of steps of the process of production of a semiconductor device of the second embodiment of the present invention;

FIG. 14A is a cross-sectional view of an example of a vertical pnp transistor as a semiconductor device of a third embodiment of the present invention, while FIG. 14B is a cross-sectional view of a step of the process of production of a semiconductor device of the third embodiment of the present invention;

FIG. 15A and FIG. 15B are cross-sectional views of steps of the process of production of a semiconductor device of the third embodiment of the present invention;

FIG. 17A and FIG. 17B are cross-sectional views of steps of the process of production of a semiconductor device of the third embodiment of the present invention;

FIG. 18A is a cross-sectional view of an example of a vertical pnp transistor as a semiconductor device of a fourth embodiment of the present invention, while

FIG. 20A and FIG. 20B are cross-sectional views of steps of the process of production of a semiconductor device of the fourth embodiment of the present invention;

FIG. 21A is a cross-sectional view of an example of a MIS capacitor as a semiconductor device of a fifth embodiment of the present invention, while

FIG. 24A is a cross-sectional view of an example of a polysilicon resistor as a semiconductor device of a sixth embodiment of the present invention, while

DESCRIPTION OF THE PREFERRED EMBODIMENTS

Below, preferred embodiments of the semiconductor device and process of production of the same of the present invention will be described with reference to the accompanying drawings.

The semiconductor device of the present invention employs a stacked film of an NSG/PSG/NSG sandwiched structure as an insulating film formed in the element. Due to this, it becomes possible to utilize a gettering ability of PSG and prevent diffusion of impurities to a substrate, insulating film on the substrate, or conductive layer. Also, due to sandwiching the PSG film between the NSG films, autodoping of phosphorus etc. from the PSG film is prevented. Therefore, a highly reliable transistor which is prevented from changes in characteristics etc. due to autodoping can be obtained.

(First Embodiment)

Figure 1:
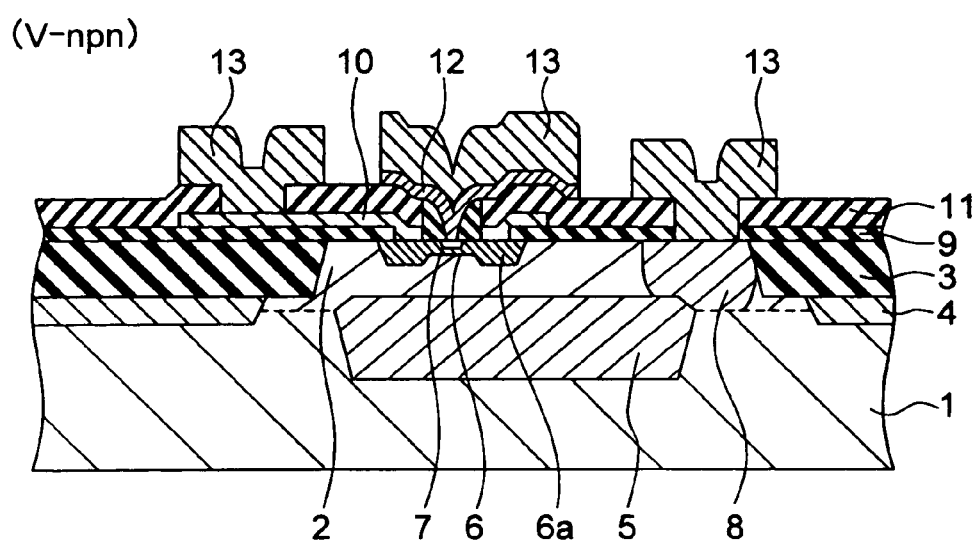
FIG. 1 is a cross-sectional view of an example of a vertical npn transistor as a semiconductor device of the related art.
Figure 4:
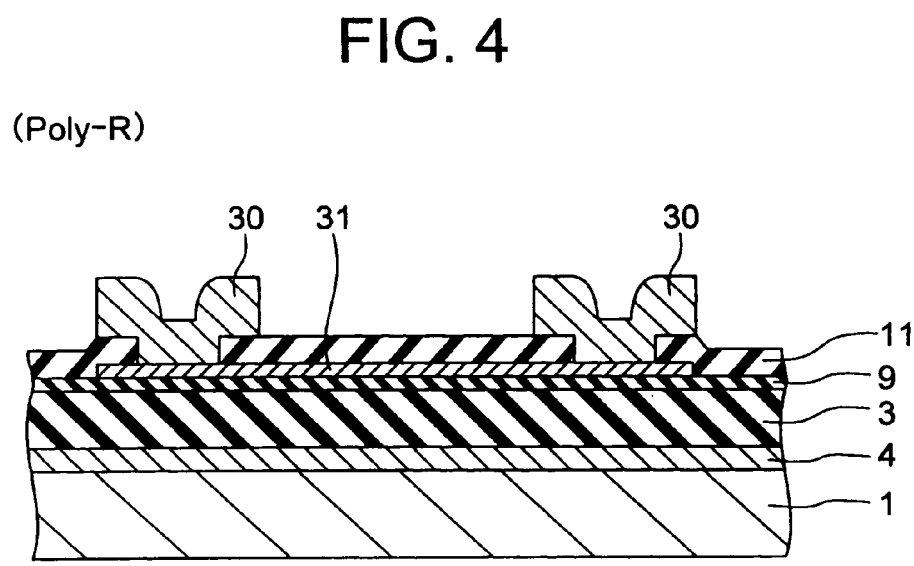
FIG. 4 is a cross-sectional view of an example of a polysilicon resistor as a semiconductor device of the related art.
Figure 5A:
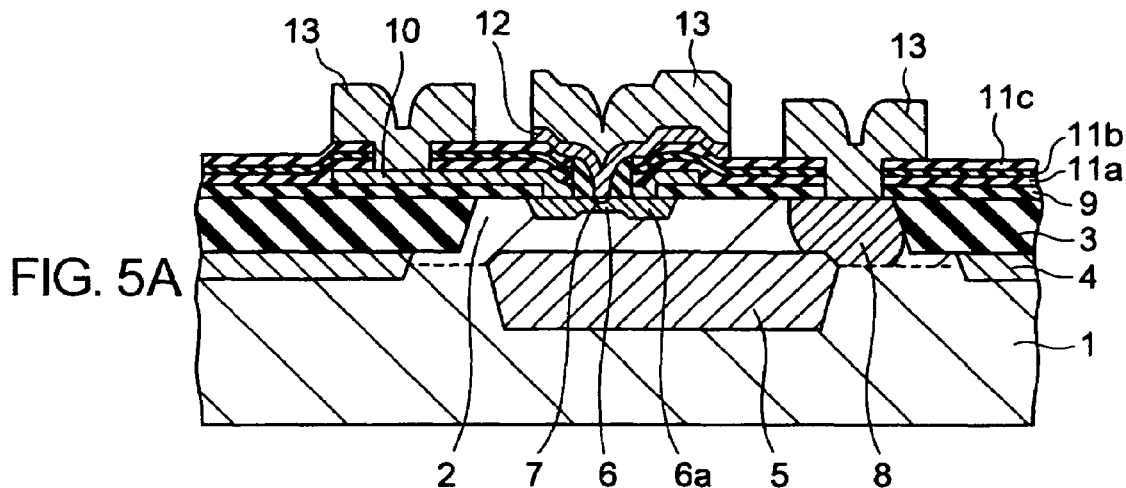

FIG. 5A is a cross-sectional view of a semiconductor device of the present embodiment and shows a vertical npn transistor (V-npn). As shown in FIG. 5A, on a p-type semiconductor substrate 1 is formed an n-type epitaxial layer 2. On the surface of the n-type epitaxial layer 2 is formed a LOCOS 3 for separating elements. Below the LOCOS 3 is formed an element separating diffusion layer 4 containing a p-type impurity. The element separating diffusion layer 4 reaches the p-type semiconductor substrate 1.

At the surface layer of the p-type semiconductor substrate 1 is formed an n-type collector buried layer 5 on which the n-type epitaxial layer 2 becomes an n-type collector layer. At the surface layer of the n-type epitaxial layer 2 comprised of the n-type collector layer is formed a p-type base region 6. Around the p-type base region 6 is formed a graft base 6a. At the surface layer of the p-type base region 6 is formed an n-type emitter region 7. Also, in the n-type epitaxial layer 2 is formed a collector plug region (n$^+$ sinker) 8 connected to the n-type collector buried layer 5.

On the n-type epitaxial layer 2 or LOCOS 3 is formed for example a silicon oxide film 9 as a first insulating film. In the silicon oxide film 9 on the p-type base region 6 is formed an opening. In the opening and on the silicon oxide film 9 around the opening is formed a first polysilicon layer (p-type base electrode 10) which is connected to the p-type base region 6 and becomes a base take-out part. In the p-type base electrode 10 on the n-type emitter region 7 is formed an opening.

On the p-type base electrode 10 or silicon oxide film 9 is formed a stacked film of an NSG film 11a, PSG film 11b, and NSG film 11c as a second to fourth insulating films. In the NSG/PSG/NSG stacked film 11a, 11b, 11c on the n-type emitter region 7 is formed an opening. In the opening and on the NSG/PSG/NSG stacked film 11a, 11b, 11c around the opening is formed an n-type emitter polysilicon layer 12. The n-type emitter polysilicon layer 12 is connected to the n-type emitter region 7 and becomes an emitter take-out part.

On a part of the p-type base electrode 10, n-type emitter polysilicon layer 12, and collector plug region 8 are formed electrodes 13.

Next, a process of production of the above semiconductor device of the present embodiment will be explained.

Figure 5B:
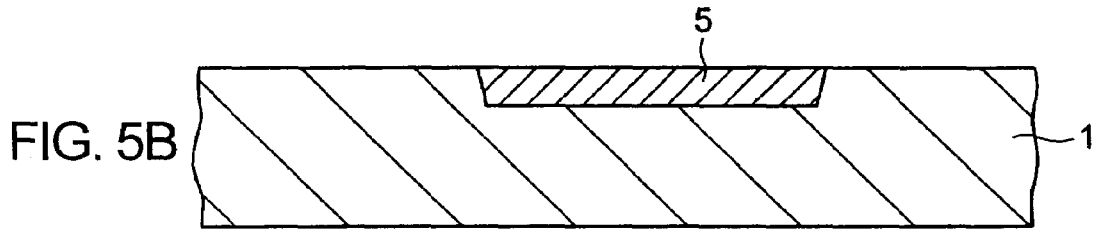
FIG. 5B and FIG. 5C are cross-sectional views of steps of the process of production of a semiconductor device of the first embodiment of the present invention.

First, as shown in FIG. 5B, the n-type collector buried layer 5 is formed at the surface layer of the p-type semiconductor substrate 1. For forming the n-type collector buried layer 5, first, an oxide film (not shown) is formed on the p-type semiconductor substrate 1 by heat oxidation to a thickness of for example about 300 nm. An opening is formed at the n-type collector buried layer 5 forming region in the oxide film. Then, Sb is diffused into the p-type semiconductor substrate 1 by vapor phase diffusion via the opening. The vapor phase diffusion using $Sb_2O_3$ as an ingredient is performed at about 1200° C. After this, the oxide film is removed.

Figure 5C:
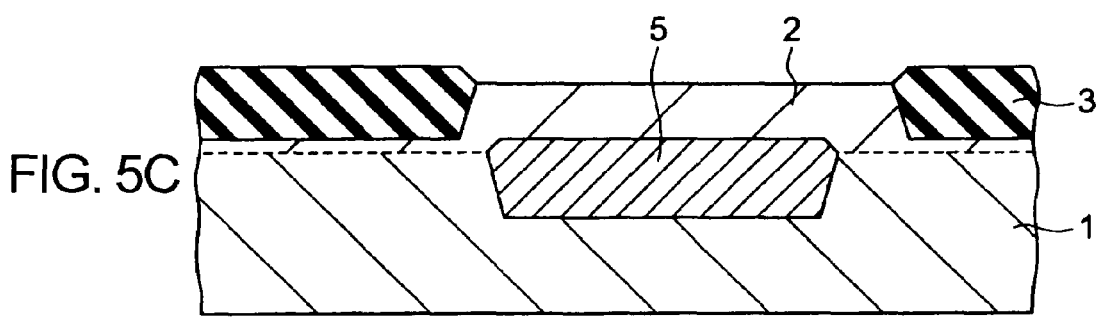

Next, as shown in FIG. 5C, an n-type epitaxial layer 2 having a resistivity of for example 0.3 to 5.0 Ω·cm and thickness of about 0.7 to 2.0 μm is formed on the p-type semiconductor substrate 1. Next, using a silicon nitride film (not shown) as a mask, steam oxidation is performed on the surface of the n-type epitaxial layer 2 and the LOCOS 3 is formed to a thickness of for example about 0.8 to 1.5 μm. After this, the silicon nitride film is removed by etching using hot phosphoric acid.

Figure 6A:
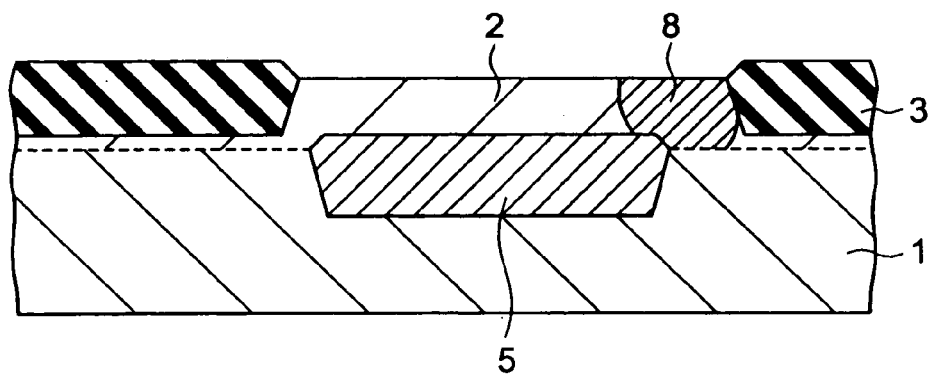
FIGS. 6A to 6C are cross-sectional views of steps of the process of production of a semiconductor device of the first embodiment of the present invention.

Next, as shown in FIG. 6A, the collector plug region 8 is formed in the n-type epitaxial layer 2. For forming the collector plug region 8, using a photoresist as a mask, for example phosphorus is ion-implanted under conditions of an ion energy of 40 to 100 keV and a dosage of $1\times10^{15}$ to $1\times10^{16}$ atoms/cm$^2$. After this, heat treatment is performed at for example 900 to 1000° C. for about 30 min for diffusing the impurity. Due to this, the collector plug region 8 is formed.

Figure 6B:
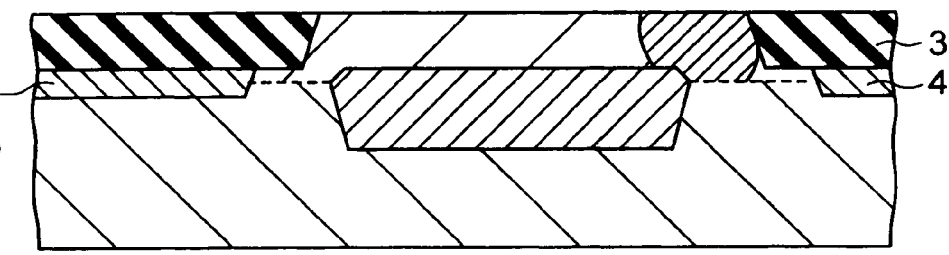

Next, as shown in FIG. 6B, using a photoresist (not shown) as a mask, RIE is performed for etching a bird's head of the LOCOS 3. Due to this, the LOCOS 3 is made flat.

Further, the element separating diffusion layer 4 is formed below the LOCOS 3. For forming the element separating diffusion layer 4, using a photoresist as a mask, for example, boron is ion-implanted under conditions of an ion energy of 200 to 500 keV and a dosage of $1\times10^{13}$ to $1\times10^{14}$ atoms/cm$^2$.

Figure 6C:
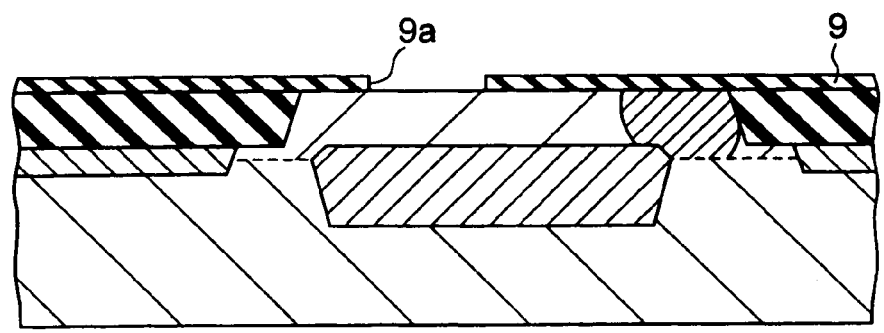

Next, as shown in FIG. 6C, the silicon oxide film 9 is formed by CVD over the entire surface to a thickness of about 50 to 200 nm. Next, an opening 9a is formed by RIE using for example $O_2/CHF_3$ gas system in the silicon oxide film 9.

Figure 7A:
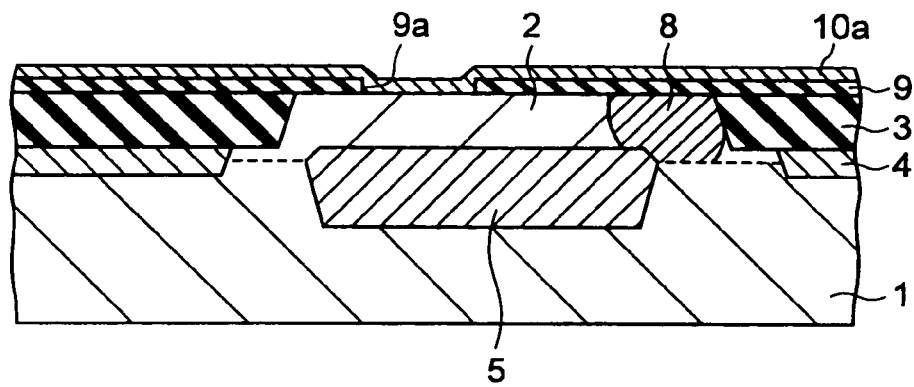
FIGS. 7A to 7C are cross-sectional views of steps of the process of production of a semiconductor device of the first embodiment of the present invention.

Next, as shown in FIG. 7A, a polysilicon layer 10a is formed by CVD over the entire surface including the opening 9a to a thickness of about 100 to 300 nm. After this, for example $BF_2$ is ion-implanted in the polysilicon layer 10a under conditions of an ion energy of 30 to 70 keV and a dosage of $1\times10^{14}$ to $1\times10^{16}$ atoms/cm$^2$ for making the polysilicon layer 10a a p-type polysilicon layer.

Figure 7B:
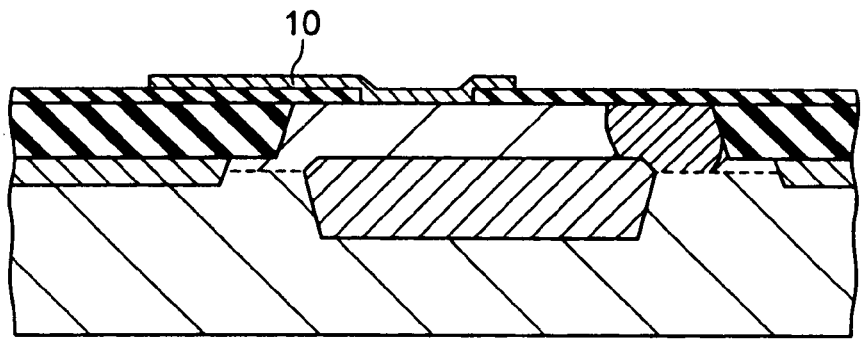

Next, as shown in FIG. 7B, using a photoresist as a mask, RIE is performed on the polysilicon layer 10a for forming the p-type base electrode 10. For example $C_2Cl_3F_3/SF_6$ gas system is used for the RIE.

Figure 7C:
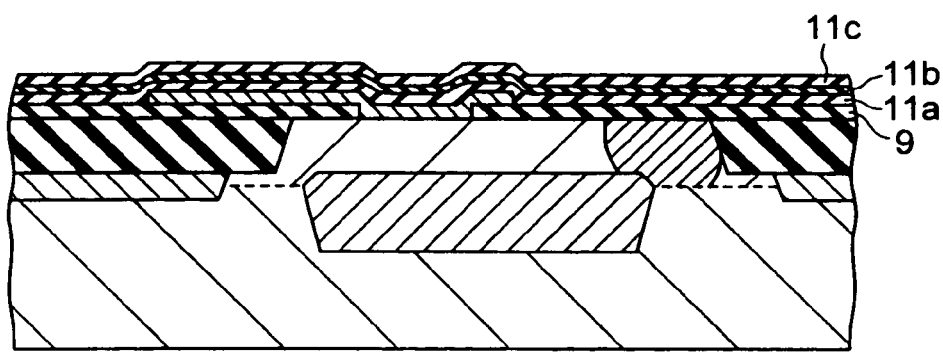

Next, as shown in FIG. 7C, the NSG film 11a, PSG film 11b, and NSG film 11c are sequentially stacked over the entire surface. The thickness of the NSG film 11a is made for example 100 nm, that of the PSG film 11b is made 50 nm, and that of the NSG film 11c is made 250 nm. The NSG/PSG/NSG stacked film 11a, 11b, 11c can be formed by for example three different CVD steps. Alternatively, it is also possible to form the desired NSG/PSG/NSG stacked films 11a, 11b, 11c continuously by a CVD process while changing the amount of supply of phosphorus during the process.

The thickness of the PSG film 11b is suitably set within a range where the gettering ability of the PSG film 11b works effectively and autodoping from the PSG film 11b is prevented, for example, within a range from 10 nm to 30 nm.

Also, even if the PSG film 11b is changed to a BPSG film, autodoping can be prevented by a similar gettering ability.

Figure 8A:
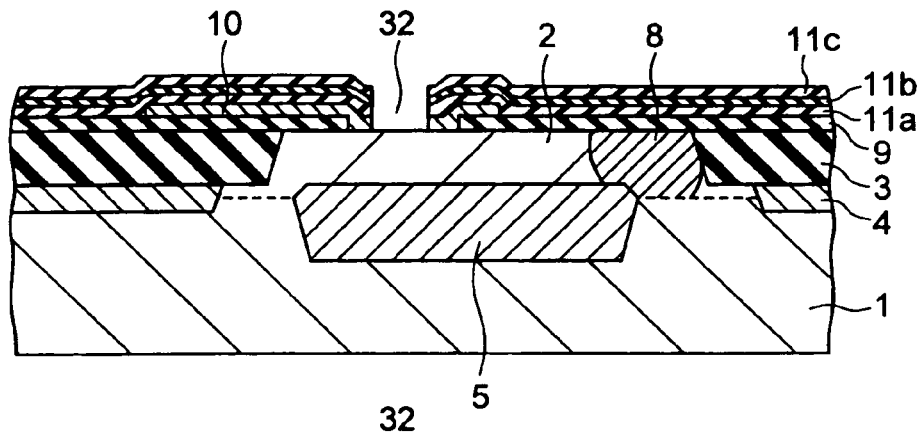
FIGS. 8A to 8C are cross-sectional views of steps of the process of production of a semiconductor device of the first embodiment of the present invention.

Next, as shown in FIG. 8A, using a photoresist (not shown) as a mask, RIE is performed on the NSG/PSG/NSG stacked films 11a, 11b, 11c and p-type base electrode 10 for forming an emitter opening 32. For etching of the NSG/PSG/NSG stacked films 11a, 11b, 11c for example $O_2/CHF_3$ gas system is used. For etching of the p-type base electrode 10, for example a $C_2Cl_3F_3/SF_6$ gas system is used.

Figure 8B:
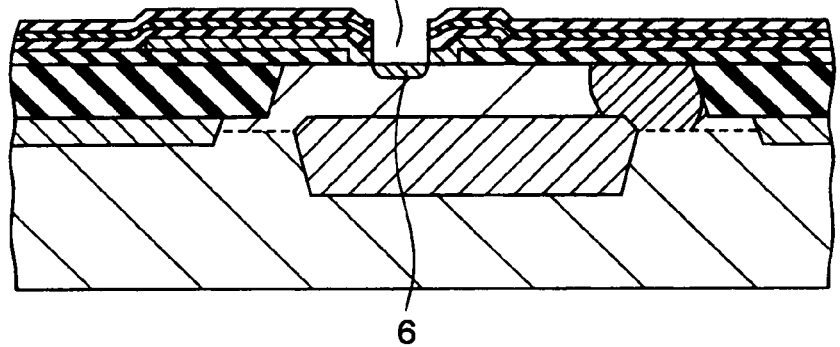

Next, as shown in FIG. 8B, the p-type base region (intrinsic base region) 6 is formed in the n-type epitaxial-layer 2 at the bottom of the emitter opening 32. For forming the p-type base region 6, first, an oxide film (not shown) is formed by heat oxidation of the n-type epitaxial layer 2 at the bottom of the emitter opening 32 to a thickness of about 5 to 30 nm. For example $BF_2$ is ion-implanted under conditions of an ion energy of 20 to 100 keV and a dosage of $1\times10^{13}$ to $1\times10^{14}$ atoms/cm$^2$ via the oxide film.

Figure 8C:
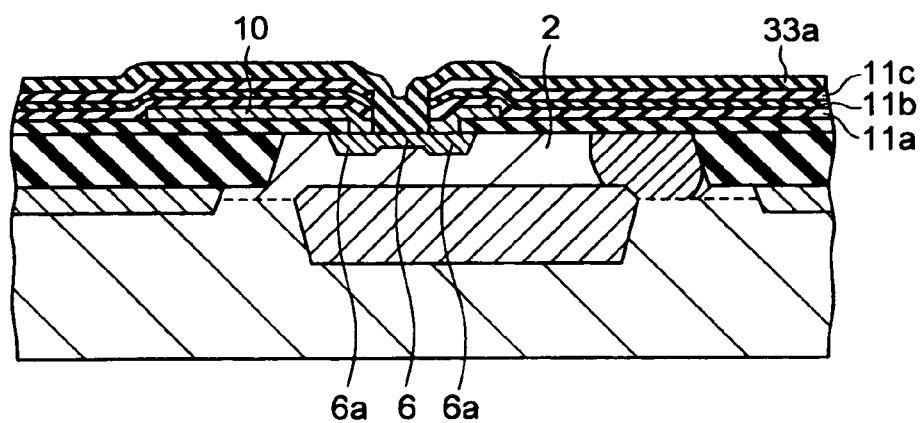

Next, as shown in FIG. 8C, a silicon oxide film 33a for forming sidewalls of the emitter opening 32 is formed by CVD over the entire surface to a thickness of about 300 to 600 nm. Next, base annealing is performed for example at 800 to 950° C. for 10 to 60 min to diffuse a p-type impurity from the p-type base electrode 10 to the n-type epitaxial layer 2 and form the graft base 6a. Also, the p-type impurity ion-implanted in the intrinsic base region 6 diffuses due to this base annealing.

Figure 9A:
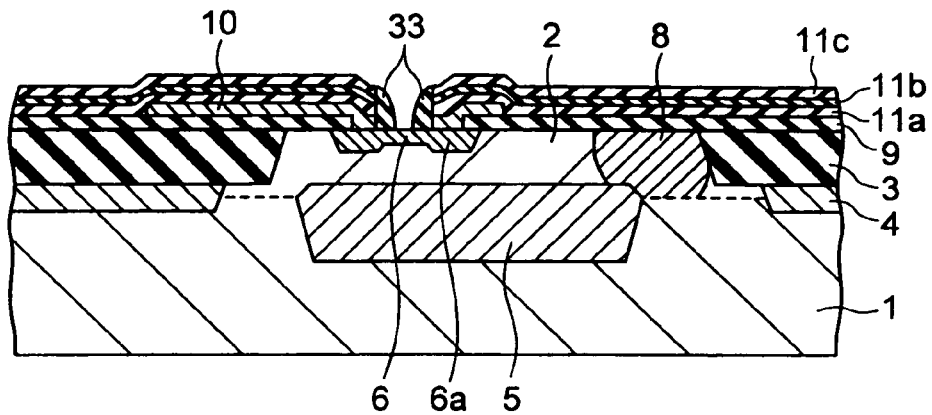
FIGS. 9A to 9C are cross-sectional views of steps of the process of production of a semiconductor device of the first embodiment of the present invention.

Next, as shown in FIG. 9A, RIE is performed on the silicon oxide film 33a for forming sidewalls 33 at the emitter opening 32. For example an $O_2/CHF_3$ gas system can be used for this RIE.

Figure 9B:
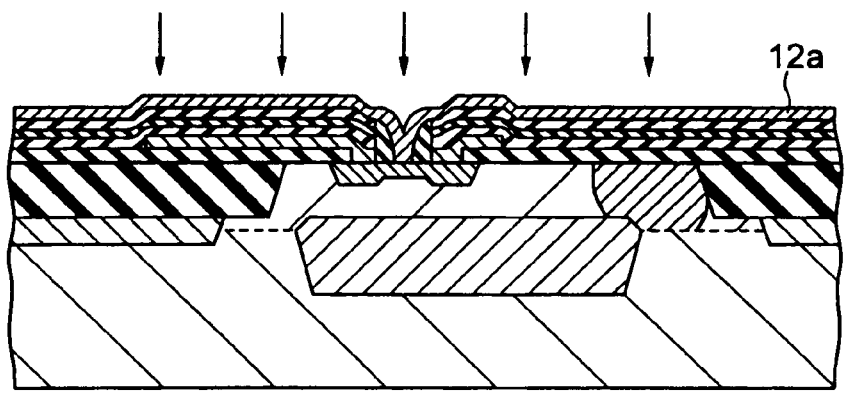

Next, as shown in FIG. 9B, a polysilicon layer 12a for forming the n-type emitter polysilicon layer 12 is formed by CVD over the entire surface to a thickness of about 50 to 200 nm. After this, for example arsenic is ion-implanted as an n-type impurity in the polysilicon layer 12a under conditions of an ion energy of 30 to 100 keV and a dosage of $1\times10^{15}$ to $1\times10^{16}$ toms/cm2.

Figure 9C:
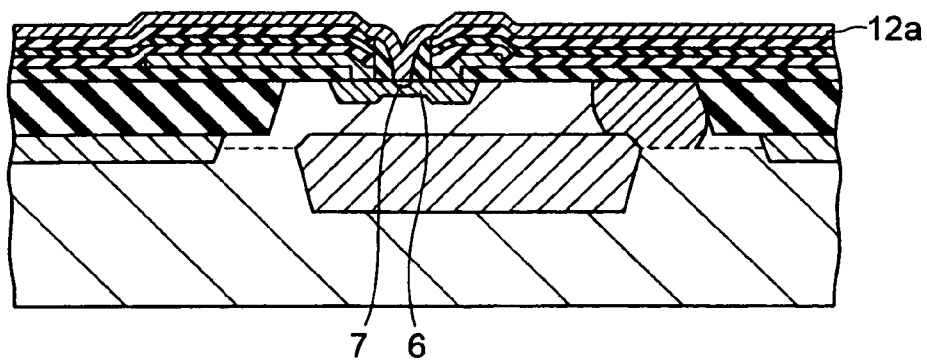

Next, as shown in FIG. 9C, emitter annealing is performed for example at 800° C. or higher for 10s of minutes or at 900 to 1100° C. for several minutes to 10s of minutes to diffuse an n-type impurity from the polysilicon layer 12a to the p-type base region 6 for forming the n-type emitter region 7.

Figure 10A:
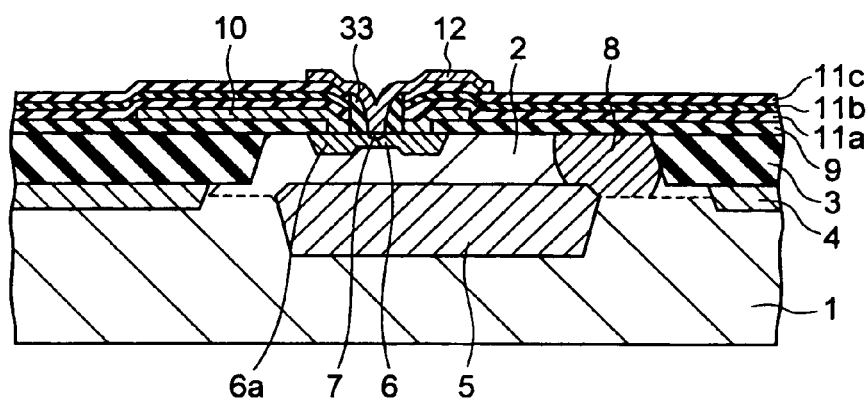
FIGS. 10A and 10B are cross-sectional views of steps of the process of production of a semiconductor device of the first embodiment of the present invention.

Next, as shown in FIG. 10A, RIE is performed on the polysilicon layer 12a for forming the n-type emitter polysilicon layer 12. For example, a $C_2Cl_3F_3/SF_6$ gas system can be used for this RIE.

Figure 10B:
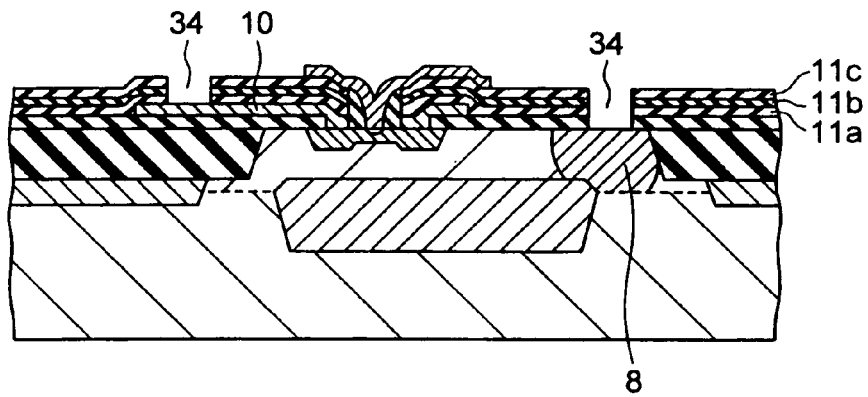

Next, as shown in FIG. 10B, RIE is performed on a base take-out part of the p-type base electrode 10 and the NSG/PSG/NSG stacked films 11a, 11b, 11c on the collector plug region 8 for forming an opening 34. For example, an $O_2/CHF_3$ gas system can be used for etching the NSG/PSG/NSG stacked films 11a, 11b, 11c.

Next, a barrier metal layer comprised of for example titanium or titanium nitride and a metal layer comprised of aluminum or aluminum alloy etc. are stacked by sputtering over the entire surface and then RIE is performed. Due to this, electrodes 13 are formed on the base take-out part, n-type emitter polysilicon layer 12, and collector plug region 8. Due to the above process, the semiconductor device of the present embodiment shown in FIG. 5A is obtained. After this, upper interconnections, a passivation film, etc. are suitably formed.

(Second Embodiment)

FIG. 11A is a cross-sectional view of a semiconductor device of the present embodiment and shows a lateral pnp transistor (L-pnp). As shown in FIG. 11A, on a p-type semiconductor substrate 1 is formed an n-type epitaxial layer 2. On the surface of the n-type epitaxial layer 2 is formed a LOCOS 3 for separating elements. Below the LOCOS 3 is formed an element separating diffusion layer 4 containing a p-type impurity. The element separating diffusion layer 4 reaches the p-type semiconductor substrate 1.

At the surface layer of the p-type semiconductor substrate 1 is formed an n-type base buried layer 14 whereon the n-type epitaxial layer 2 becomes an n-type base layer. At the surface layer of the n-type epitaxial layer 2 comprised of the n-type base layer are formed a p-type emitter region 15 and a p-type collector region 16 separate from each other. Also, in the n-type epitaxial layer 2 is formed a base plug region (n+ sinker) 17 connected to the n-type base buried layer 14.

On the n-type epitaxial layer 2 or LOCOS 3 is formed for example a silicon oxide film 9 as a first insulating film. In the silicon oxide film 9 on the p-type emitter region 15 and the p-type collector region 16 is formed an opening. At the opening on the p-type emitter region 15 is formed an emitter take-out electrode 18 comprised of a p-type polysilicon layer. In the same way, at the opening on the p-type collector region 16 is formed a collector take-out electrode 19 comprised of a p-type polysilicon layer.

On the emitter take-out electrode 18, collector take-out electrode 19, or silicon oxide film 9 is formed an NSG/PSG/NSG stacked film 11a, 11b, 11c as a second to fourth insulating film.

In the NSG/PSG/NSG stacked film 11a, 11b, 11c on the emitter take-out electrode 18, collector take-out electrode 19, and base plug region 17 are formed openings where electrodes 13 are formed.

Next, a process of production of the above semiconductor device of the present embodiment will be explained.

First, as shown in FIG. 11B, the n-type base buried layer 14 is formed at the surface layer of the p-type semiconductor substrate 1. For forming the n-type base buried layer.14, using a photoresist (not shown) as a mask, for example phosphorus is ion-implanted under conditions of an ion energy of 300 keV or more and a dosage of $1 \times 10^{13}$ to $1 \times 10^{15}$ atoms/$cm^2$. After this, the photoresist is removed.

Next, as shown in FIG. 12A, in the same way as the first embodiment, the n-type epitaxial layer 2 is formed on the p-type semiconductor substrate 1 and the LOCOS 3 is formed on the surface of the n-type epitaxial layer 2. Further, the base plug region 17 is formed in the n-type epitaxial layer 2. For forming the base plug region 17, using a photoresist as a mask, for example phosphorus is ion-implanted under conditions of an ion energy of 40 to 100 keV and a dosage of $1 \times 10^{15}$ to $1 \times 10^{16}$ atoms/$cm^2$. After this, heat treatment is performed at for example 900 to 1000° C. for about 30 minutes to diffuse the impurity.

When the L-pnp of the present embodiment is mounted mixed on the same substrate with the V-npn of the first embodiment, it is possible to form the collector plug region 8 of the V-npn and the base plug region 17 of the L-pnp simultaneously.

Next, in the same way as the first embodiment, the bird's head of the LOCOS 3 is etched to flatten the LOCOS 3. After this, in the same way as the first embodiment, a p-type impurity is ion-implanted at the LOCOS 3 part to form the element separating diffusion layer 4.

Next, as shown in FIG. 12B, a silicon oxide film 9 is formed by CVD over the entire surface to a thickness of about 50 to 200 nm. Next, RIE is performed in the silicon oxide film 9 on the emitter forming region and collector forming region to form an opening 35. For example, an $O_2/CHF_3$ gas system can be used for RIE for forming the opening 35. After this, a polysilicon layer 10a is formed by CVD on the silicon oxide film 9 including in the opening 35 to a thickness of about 100 to 300 nm.

Figures 13A, 13B:
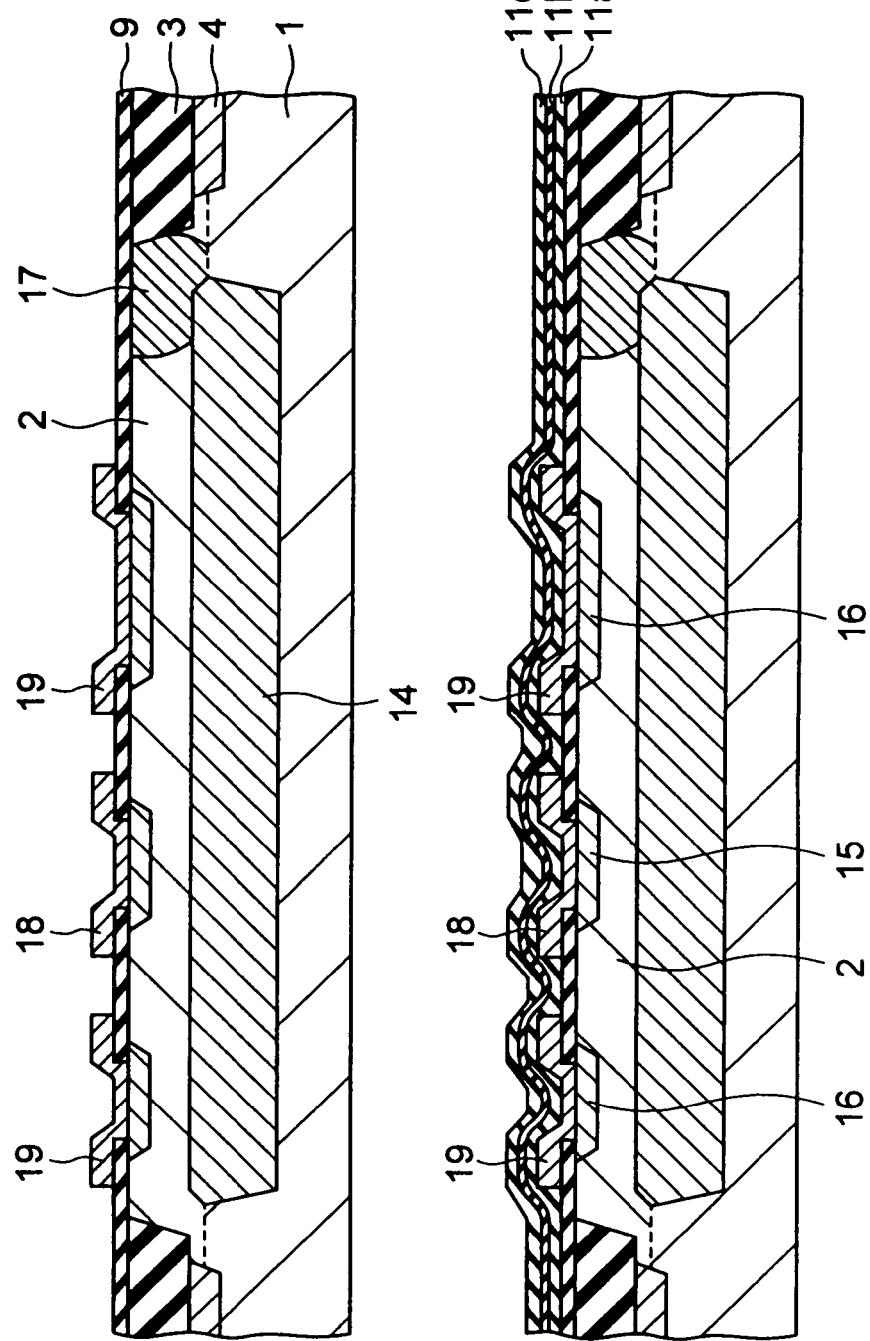
FIGS. 13A and 13B are cross-sectional views of steps of the process of production of a semiconductor device of the second embodiment of the present invention.

Next, as shown in FIG. 13A, using a photoresist (not shown) as a mask, RIE is performed on the polysilicon layer 10a to form the emitter take-out electrode 18 and collector take-out electrode 19. For example, a $C_2Cl_3F_3/SF_6$ gas system can be used for this RIE.

When the L-pnp of the present embodiment is mounted mixed on the same substrate with the V-npn of the first embodiment, it is possible to form the p-type base electrode 10 of the V-npn and the emitter take-out electrode 18 and collector take-out electrode 19 of the L-pnp simultaneously.

Next, as shown in FIG. 13B, an NSG film 11a, PSG film 11b, and NSG film 11c are stacked sequentially over the entire surface. The thickness of the NSG film 11a is set at for example 100 nm, that of the PSG film 11b is set at 50 nm, and that of the NSG film 11c is set at 250 nm. The NSG/PSG/NSG stacked film 11a, 11b, 11c can be formed by for example three different CVD process or a CVD process wherein the amount of supply of phosphorus is changed during the process.

Also, even when the PSG film 11b is changed to a BPSG film, it is possible to prevent autodoping due to its similar gettering ability.

After this, heat treatment is performed for example at 900 to 1000° C. for 10 to 60 minutes under a nitrogen atmosphere for diffusing a p-type impurity from the emitter take-out electrode 18 to the n-type epitaxial layer 2 to form the p-type emitter region 15. At the same time, the p-type impurity is diffused from the collector take-out electrode 19 to the n-type epitaxial layer 2 to form the p-type collector region 16.

When the L-pnp of the present embodiment is mounted mixed on the same substrate with the V-npn of the first embodiment, it is possible to form the graft base 6a of the V-npn and the p-type emitter region 15 and p-type collector region 16 of the L-pnp simultaneously.

After this, RIE is performed on the NSG/PSG/NSG stacked films 11a, 11b, 11c on the emitter take-out electrode 18 and collector take-out electrode 19 to form openings. On the other hand, due to this RIE, an opening is also formed in the NSG/PSG/NSG stacked films 11a, 11b, 11c and silicon oxide film 9 on the base plug region 17. By forming electrodes 13 comprising for example a barrier metal layer and metal layer at the openings in the same way as the first embodiment, the semiconductor device shown in FIG. 11A can be obtained.

(Third Embodiment)

FIG. 14A is a cross-sectional view of a semiconductor device of the present embodiment and shows a vertical pnp transistor (V-pnp). As shown in FIG. 14A, on a p-type semiconductor substrate 1 is formed an n-type epitaxial layer 2. On the surface of the n-type epitaxial layer 2 is formed a LOCOS 3 for separating elements. Below the LOCOS 3 is formed an element separating diffusion layer 4 containing a p-type impurity. The element separating diffusion layer 4 reaches the p-type semiconductor substrate 1.

At the surface layer of the p-type semiconductor substrate 1 is formed an n-type buried layer 20 whereon a p-well which becomes a p-type collector region 21 is formed. Due to the n-type buried layer 20, the p-type collector region 21 and p-type semiconductor substrate 1 are electrically separated. At the surface layer of the p-type collector region 21 formed an n-type base region 22 and graft base 22a connected to the base region 22. At the surface layer of the n-type base region 22 is formed a p-type emitter region 23. Also, at the surface layer of the p-type collector region 21 is formed a collector take-out part 24 separate from the n-type base region 22 and graft base 22a. The collector take-out part 24 contains a p-type impurity at a higher concentration than the p-type collector region 21.

On the n-type epitaxial layer 2 or LOCOS 3 is formed for example a silicon oxide film 9 as a first insulating film. In the silicon oxide film 9 on the p-type emitter region 23 and collector take-out part 24 are formed openings. At the opening on the p-type emitter region 23 is formed an emitter take-out electrode 25 comprised of p-type polysilicon. In the same way, at the opening on the collector take-out part 24 is formed a collector take-out electrode 26 comprised of p-type polysilicon.

On the emitter take-out electrode 25, collector take-out electrode 26, or silicon oxide film 9 is formed a stacked film of an NSG film 11a, PSG film 11b, and NSG film 11c as second to fourth insulating films.

In the NSG/PSG/NSG stacked films 11a, 11b, 11c on the base take-out part, emitter take-out electrode 25, and collector take-out electrode 26 are formed openings where electrodes 13 are formed.

Next, a process of production of the above semiconductor device of the present embodiment will be explained.

First, as shown in FIG. 14B, the n-type buried layer 20 is formed at the surface layer of the p-type semiconductor substrate 1. For forming the n-type buried layer 20, in the same way as the case of forming the n-type collector buried layer 5 of the V-npn of the first embodiment, using an oxide film as a mask, $Sb_2O_3$ is diffused by vapor phase diffusion at about 1200° C. After this, the oxide film is removed.

When the V-pnp of the present embodiment is mounted mixed on the same substrate with the V-npn of the first embodiment, it is possible to form the n-type collector buried layer 5 of the V-npn and the n-type buried layer 20 of the V-pnp simultaneously.

Next, as shown in FIG. 15A, in the same way as the first embodiment, the n-type epitaxial layer 2 is formed on the p-type semiconductor substrate 1 and the LOCOS 3 is formed on the surface of the n-type epitaxial layer 2. Further, the bird's head of the LOCOS 3 is etched to flatten the LOCOS 3.

Next, using a photoresist as a mask, a p-type impurity is ion-implanted in the n-type epitaxial layer and LOCOS 3 part on the n-type buried layer 20 to form the p-type collector region 21 and element separating diffusion layer 4.

Next, as shown in FIG. 15B, the n-type base region 22 and graft base 22a are formed at the surface layer of the p-type collector region 21. After this, a silicon oxide film is formed by CVD over the entire surface to a thickness of about 50 to 200 nm.

Figure 16A:
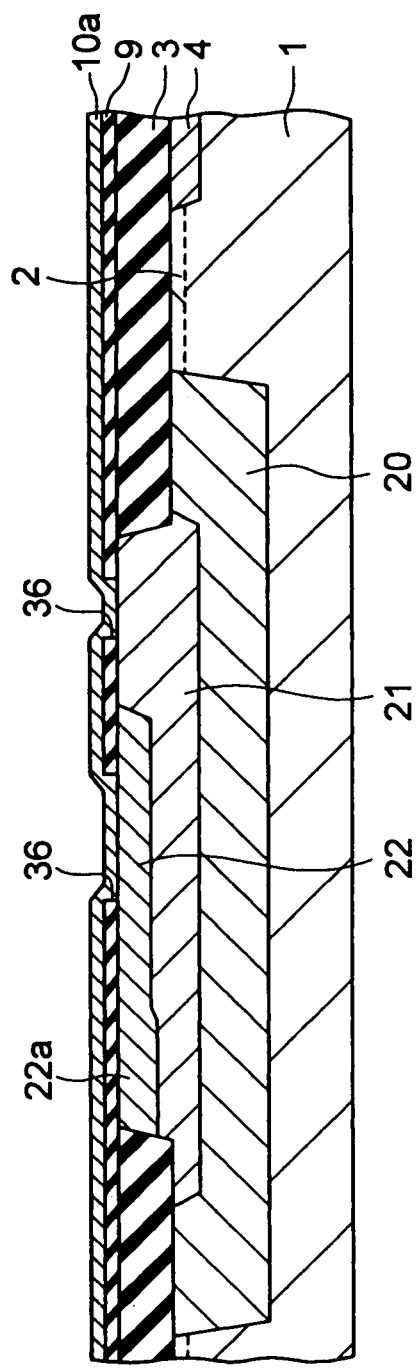
FIG. 16A and FIG. 16B are cross-sectional views of steps of the process of production of a semiconductor device of the third embodiment of the present invention.

Next, as shown in FIG. 16A, using a photoresist (not shown) as a mask, etching is performed on the silicon oxide film 9 to form openings 36 at an emitter forming region and collector take-out part. Next, a polysilicon layer 10a is formed by for example CVD over the entire surface including in the openings 36. For example, $BF_2$ is ion-implanted as a p-type impurity in the polysilicon layer 10a under conditions of an ion energy of 20 to 100 keV and a dosage of $1\times10^{15}$ to $1\times10^{16}$ atoms/cm$^2$.

Figure 16B:
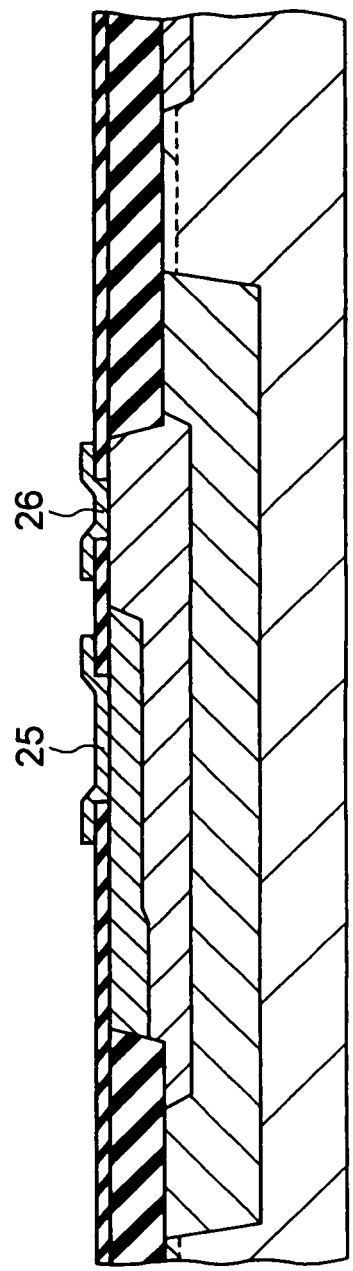

Next, as shown in FIG. 16B, the polysilicon layer 10a is etched to form the emitter take-out electrode 25 and collector take-out electrode 26.

When the V-pnp of the present embodiment is mounted mixed on the same substrate with the V-npn of the first embodiment, it is possible to form the p-type base electrode 10 of the V-npn and the emitter take-out electrode 25 and collector take-out electrode 26 of the V-pnp simultaneously. Also, when the V-pnp of the present embodiment is mounted mixed on the same substrate with the L-pnp of the second embodiment, it is possible to form the emitter take-out electrode 18 and collector take-out electrode 19 of the L-pnp and the emitter take-out electrode 25 and collector take-out electrode 26 of the V-pnp simultaneously.

Next, as shown in FIG. 17A, an NSG film 11a, PSG film 11b, and NSG film 11c are sequentially stacked over the entire surface. The thickness of the NSG film is set for example at 100 nm, that of the PSG film 11b is set at 50 nm, and that of the NSG film 11c is set at 250 nm. It is possible to form the NSG/PSG/NSG stacked films 11a, 11b, 11c by for example three different CVD process or a CVD process wherein an amount of supply of phosphorus is changed during the process.

Also, even when the PSG film 11b is changed to a BPSG film, autodoping can be prevented by its similar gettering ability.

Next, as shown in FIG. 17B, heat treatment is performed at for example 900 to 1000° C. for 10 to 60 minutes under a nitrogen gas atmosphere for diffusing the p-type impurity from the emitter take-out electrode 25 to the n-type base region 22 to form the p-type emitter region 23. In the same way, the p-type impurity is diffused from the collector take-out electrode 26 to the p-type collector region 21 to form the collector take-out part 24.

When the V-pnp of the present embodiment is mounted mixed on the same substrate with the V-npn of the first embodiment, it is possible to form the graft base 6a of the V-npn and the p-type emitter region 23 and collector take-out part 24 of the V-pnp simultaneously.

After this, RIE is performed on the NSG/PSG/NSG stacked films 11a, 11b, 11c on the graft base 22a, emitter take-out electrode 25, and collector take-out electrode 26 to form openings. By forming electrodes 13 comprising for example a barrier metal layer and metal layer at the openings, in the same way as the first embodiment, the semiconductor device shown in FIG. 14A is obtained.

(Fourth Embodiment)

Figure 18A:
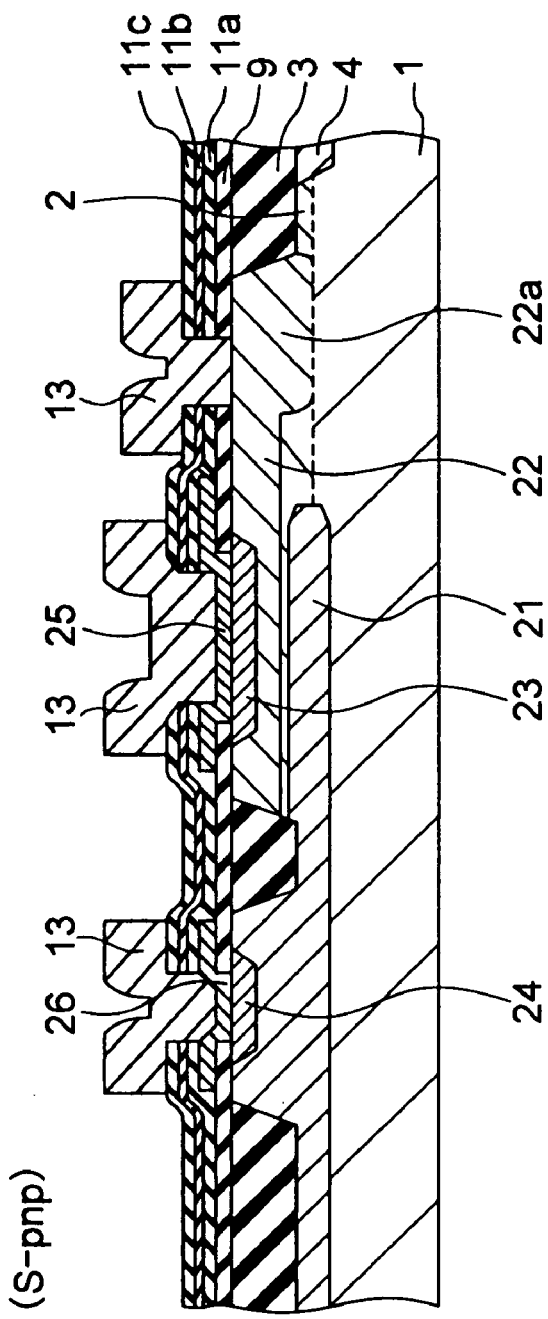

FIG. 18A is a cross-sectional view of a semiconductor device of the present embodiment and shows a vertical pnp transistor (S-pnp). As shown in FIG. 18A, on the p-type semiconductor substrate 1 is formed an n-type epitaxial layer 2. On the surface of the n-type epitaxial layer 2 is formed a LOCOS 3 for separating elements. Below the LOCOS 3 is formed an element separating diffusion layer 4 containing a p-type impurity which reaches the p-type semiconductor substrate 1.

In the n-type epitaxial layer 2 is formed a p-type collector region 21. A part of the p-type collector region 21 reaches the surface of the p-type semiconductor substrate 1. Also, in the n-type epitaxial layer 2 are formed an n-type base region 22 and graft base 22a. A part of the n-type base region 22 is formed on the p-type collector region 21. At the surface layer of the n-type base region 22 on the p-type collector region 21 is formed a p-type emitter region 23. Also, at the surface layer of the p-type collector region 21 is formed a collector take-out part 24. The collector take-out part 24 contains a p-type impurity at a higher concentration than the p-type collector region 21.

On the n-type epitaxial layer 2 or LOCOS 3 is formed for example a silicon oxide film 9 as a first insulating film. In the same way as the V-pnp shown in FIG. 14A, in the silicon oxide film 9 on the p-type emitter region 23 and collector take-out part 24 are formed openings. At the opening on the p-type emitter region 23 is formed an emitter take-out electrode 25 comprised of p-type polysilicon. In the same way, at the opening on the collector take-out part 24 is formed a collector take-out electrode 26 comprised of p-type polysilicon.

On the emitter take-out electrode 25, collector take-out electrode, or silicon oxide film 9 is formed a stacked film of an NSG film 11a, PSG film 11b, and NSG film 11c as second to fourth insulating films.

In the NSG/PSG/NSG stacked films 11a, 11b, 11c on the base take-out part, emitter take-out electrode 25, and collector take-out electrode 26 are formed openings where electrodes 13 are formed.

Next, a process of production of the semiconductor device of the above semiconductor device of the present embodiment will be explained.

Figure 18B:
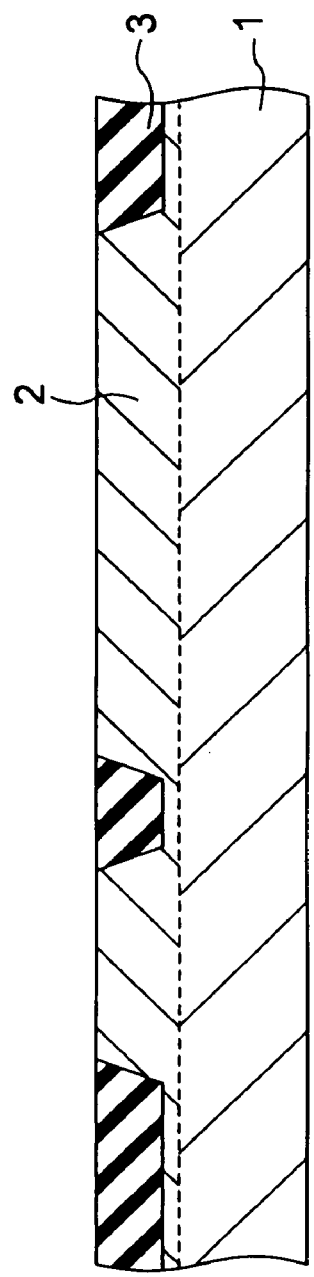
FIG. 18B is a cross-sectional view of a production step of the process of production of a semiconductor device of the fourth embodiment of the present invention.

First, as shown in FIG. 18B, the n-type epitaxial layer 2 is formed on the p-type semiconductor substrate 1 and the LOCOS 3 is formed on the surface of the n-type epitaxial layer 2. It is possible to form these parts in the same way as the first embodiment.

Figure 19A:
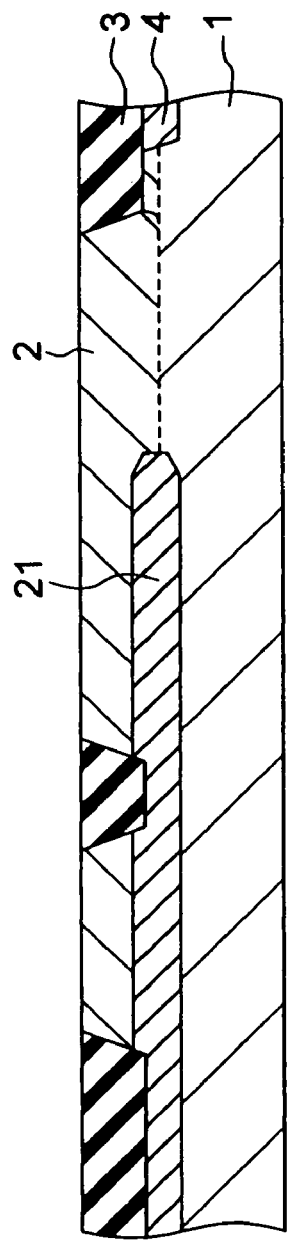
FIGS. 19A to 19C are cross-sectional views of steps of the process of production of a semiconductor device of the fourth embodiment of the present invention.

Next, as shown in FIG. 19A, the p-type collector region 21 and element separating diffusion layer 4 are formed. For forming these parts, using a photoresist (not shown) as a mask, for example boron is ion-implanted under conditions of an ion energy of 200 to 500 keV and a dosage of $1 \times 10^{13}$ to $1 \times 10^{14}$ atoms/cm². After this, the photoresist is removed.

Figure 19B:
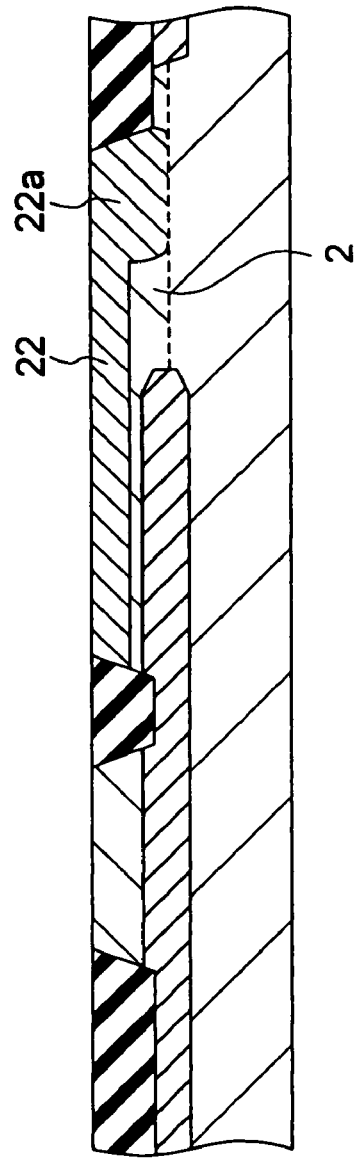

Next, as shown in FIG. 19B, the n-type base region 22 is formed in the n-type epitaxial layer 2. For forming the n-type base region 22, using a photoresist (not shown) as a mask, for example, phosphorus is ion-implanted. After this, the photoresist is removed.

Next, a photoresist (not shown) is formed for forming the graft base. Using the photoresist as a mask, for example, arsenic is ion-implanted under conditions of an ion energy of 30 to 70 keV and a dosage of $1 \times 10^{15}$ to $1 \times 10^{16}$ atoms/cm². Due to this, the graft base 22a connected to the n-type base region 22 is formed. After this, the photoresist is removed.

Figure 19C:
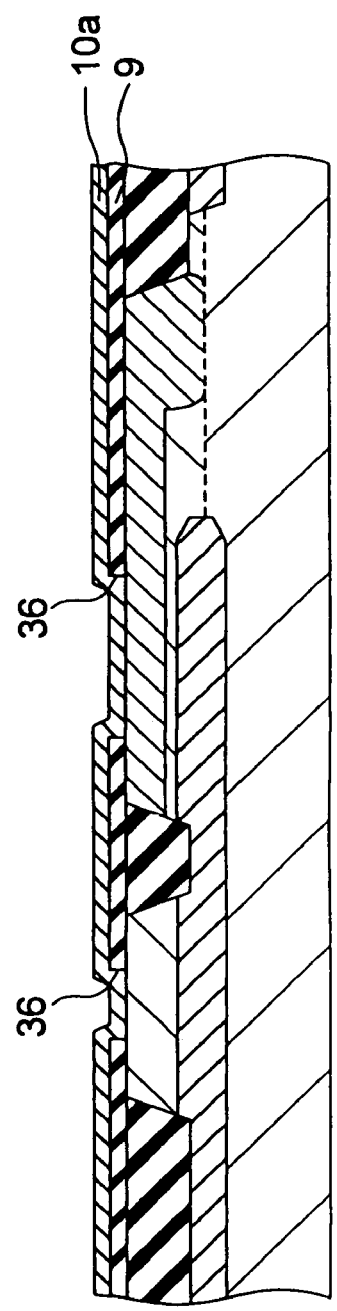

Next, as shown in FIG. 19C, the silicon oxide film 9 is formed by CVD over the entire surface to a thickness of about 50 to 200 nm. Further, using a photoresist (not shown) as a mask, the silicon oxide film 9 is etched to form openings 36 at the emitter forming region and collector take-out part.

Next, a polysilicon layer 10a is formed by for example CVD over the entire surface including in the openings 36. For example, $BF_2$ is ion-implanted as a p-type impurity in the polysilicon layer 10a under conditions of an ion energy of 20 to 100 keV and a dosage of $1 \times 10^{15}$ to $1 \times 10^{16}$ atoms/cm².

Next, as shown in FIG. 20A, the polysilicon layer 10a is etched to form the emitter take-out electrode 25 and collector take-out electrode 26.

When the S-pnp of the present embodiment is mounted mixed on the same substrate with the V-npn of the first embodiment, it is possible to form the p-type base electrode 10 of the V-npn and the emitter take-out electrode 25 and collector take-out electrode 26 of the S-pnp simultaneously. Also, when the S-pnp of the present embodiment is mounted mixed on the same substrate with the L-pnp of the second embodiment, it is possible to form the emitter take-out electrode 18 and collector take-out electrode 19 of the L-pnp and the emitter take-out electrode 25 and collector take-out electrode 26 of the S-pnp simultaneously.

Further, an NSG film 11a, PSG film 11b, and NSG film 11c are sequentially stacked over the entire surface. The thickness of the NSG film 11a is for example set at 100 nm, that of the PSG film 11b is set at 50 nm, and that of the NSG film 11c is set at 250 nm. The NSG/PSG/NSG stacked film 11a, 11b, 11c can be formed by for example three different CVD steps or a CVD process wherein an amount of supply of phosphorus is changed during the process.

Also, even when the PSG film 11b is changed to a BPSG film, it is possible to prevent autodoping due to its similar gettering ability.

Next, as shown in FIG. 20B, heat treatment is performed at for example 900 to 1000° C. for 10 to 60 minutes under a nitrogen gas atmosphere for diffusing the p-type impurity from the emitter take-out electrode 25 to the n-type base region 22 to form the p-type emitter region 23. At the same time, the p-type impurity is diffused from the collector take-out electrode 26 to the n-type epitaxial layer 2 to connect the p-type collector region 21 to the collector take-out electrode 26. Also, the collector take-out part 24 is formed near the collector take-out electrode 26.

When the S-pnp of the present embodiment is mounted mixed on the same substrate with the V-npn of the first embodiment, it is possible to form the graft base 6a of the V-npn and the p-type emitter region 23 and collector take-out part 24 of the S-pnp simultaneously.

After this, RIE is performed on the NSG/PSG/NSG stacked film 11a, 11b, 11c on the graft base 22a, emitter take-out electrode 25, and collector take-out electrode 26 to form openings. By forming electrodes 13 comprising for example a barrier metal layer and metal layer at the openings in the same way as the first embodiment, the semiconductor device shown in FIG. 18A is obtained.

(Fifth Embodiment)

FIG. 21A is a cross-sectional view of a semiconductor device of the present embodiment and shows a capacitor of a MIS structure (MIS-C). As shown in FIG. 21A, on the p-type semiconductor substrate 1 is formed an n-type epitaxial layer 2. On the surface of the n-type epitaxial layer 2 is formed a LOCOS 3 for separating elements. Below the LOCOS 3 is formed an element separating diffusion layer 4 containing a p-type impurity. The element separating diffusion layer 4 reaches the p-type semiconductor substrate 1.

In the n-type epitaxial layer 2 is formed a lower electrode layer 27 wherein an n-type impurity is diffused. On the n-type epitaxial layer 2 and LOCOS 3 is formed for example a silicon oxide film 9 as a first insulating film. In an opening formed in the silicon oxide film 9 on the lower electrode layer 27 and on the silicon oxide film 9 around the opening is formed a capacitor dielectric layer 28 comprised of for example a silicon nitride film.

On the capacitor dielectric layer 28 is formed an upper electrode 29 comprised of a p-type polysilicon layer. On the upper electrode 29 or the silicon oxide film 9 is formed a stacked film of an NSG film 11a, PSG film 11b, and NSG film 11c as second to fourth insulating films.

In the NSG/PSG/NSG films 11a, 11b, 11c on the upper electrode 29 is formed an opening wherein an interconnection 30 connected to the upper electrode 29 is formed. Also, an opening is formed in the NSG/PSG/NSG stacked films 11a, 11b, 11c on the lower electrode layer 27 except where the capacitor dielectric layer 28 and upper electrode 29 are formed. In the opening is formed an interconnection 30 connected to the lower electrode layer 27.

Next, a process of production of the above semiconductor device of the present embodiment will be explained.

Figure 21B:
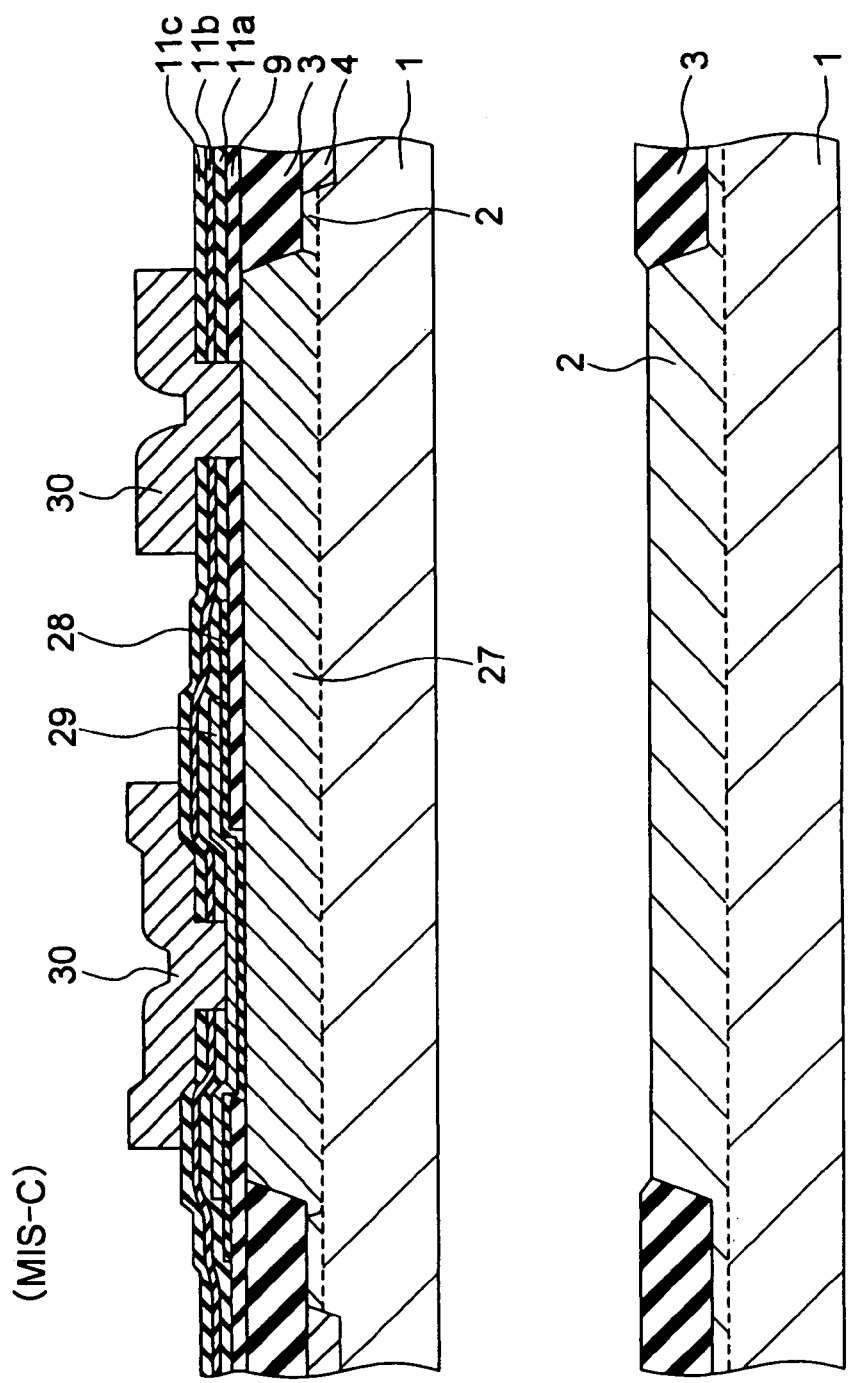
FIG. 21B is a cross-sectional view of a step of the process of production of a semiconductor device of the fifth embodiment of the present invention.

First, as shown in FIG. 21B, the n-type epitaxial layer 2 is formed on the p-type semiconductor substrate 1 and the LOCOS 3 is formed on the surface of the n-type epitaxial layer 2. It is possible to form these parts in the same way as the first embodiment.

Figure 22A:
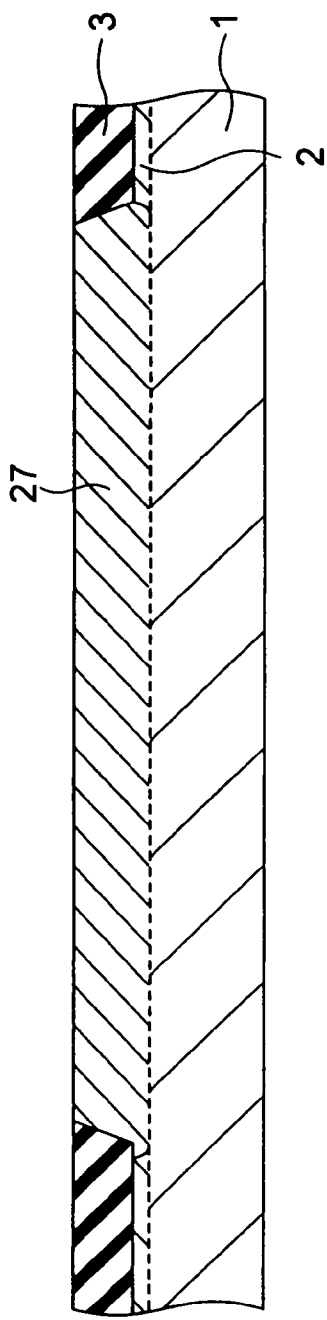
FIGS. 22A to 22C are cross-sectional views of steps of the process of production of a semiconductor device of the fifth embodiment of the present invention.

Next, as shown in FIG. 22A, the lower electrode layer 27 is formed in the n-type epitaxial layer 2. For forming the lower electrode layer 27, using a photoresist as a mask, for example phosphorus is ion-implanted under conditions of an ion energy of 50 keV and a dosage of $5 \times 10^{15}$ atoms/cm$^2$. After this, heat treatment is performed at for example 1000° C. for about 30 minutes to diffuse an impurity.

When the MIS-C of the present embodiment is mounted mixed on the same substrate with the V-npn of the first embodiment, it is possible to form the collector plug region 8 of the V-npn and the lower electrode layer 27 simultaneously.

After this, the bird's head of the LOCOS 3 is etched in the same way as the first embodiment to flatten the LOCOS 3.

Figure 22B:
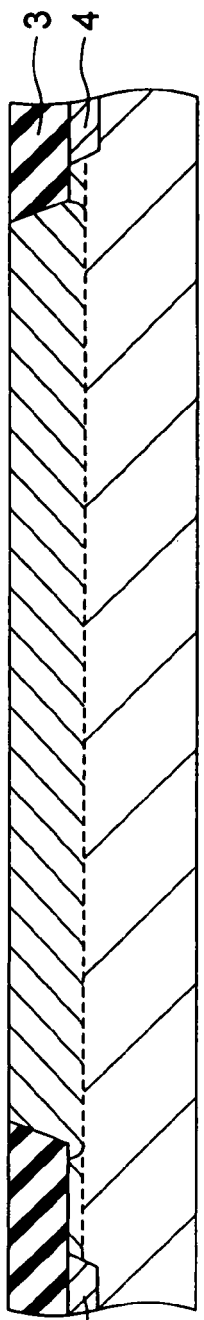

Next, as shown in FIG. 22B, in the same way as the first embodiment, a p-type impurity is ion-implanted in the LOCOS 3 part to form the element separating diffusion layer 4.

Figure 22C:
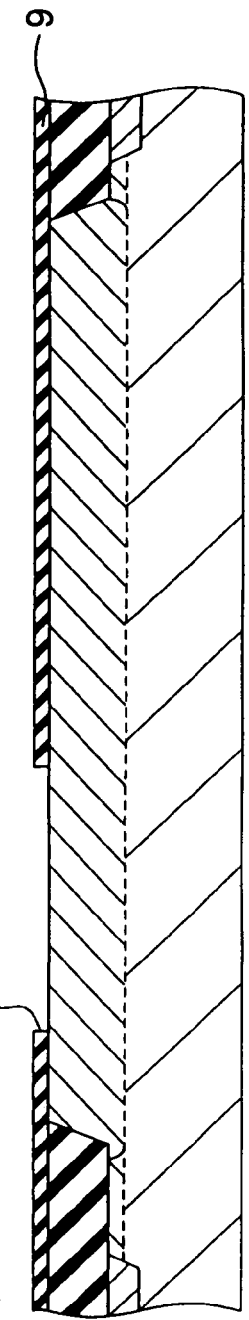

Next, as shown in FIG. 22C, the silicon oxide film 9 is formed by CVD over the entire surface to a thickness of about 50 to 200 nm. Further, using a photoresist (not shown) as a mask, the silicon oxide film 9 is etched to form an opening 37 at a capacitor forming region.

Figure 23A:
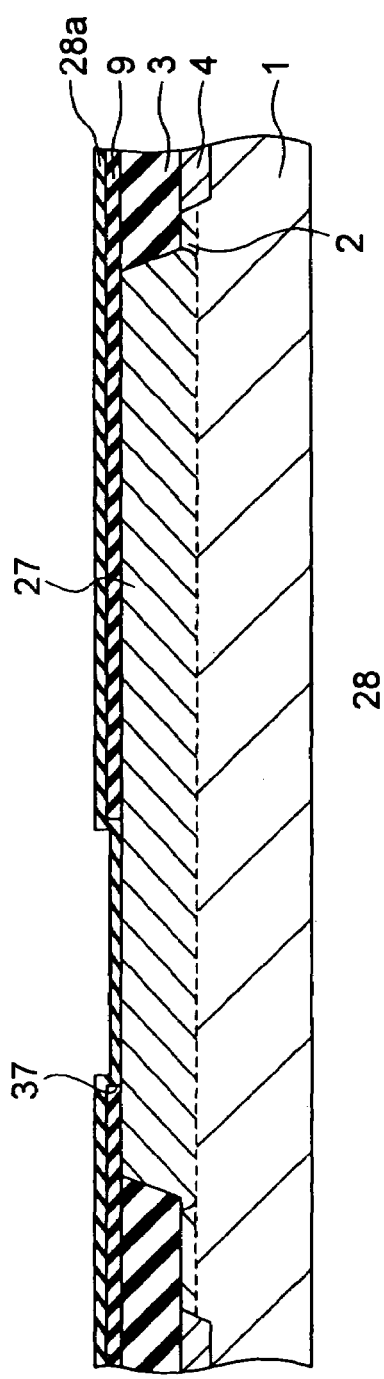
FIGS. 23A to 23C are cross-sectional views of steps of the process of production of a semiconductor device of the fifth embodiment of the presents invention.

Next, as shown in FIG. 23A, a silicon nitride film 28a is formed by for example low pressure CVD over the entire surface including in the opening 37 as the capacitor dielectric layer.

Figure 23B:
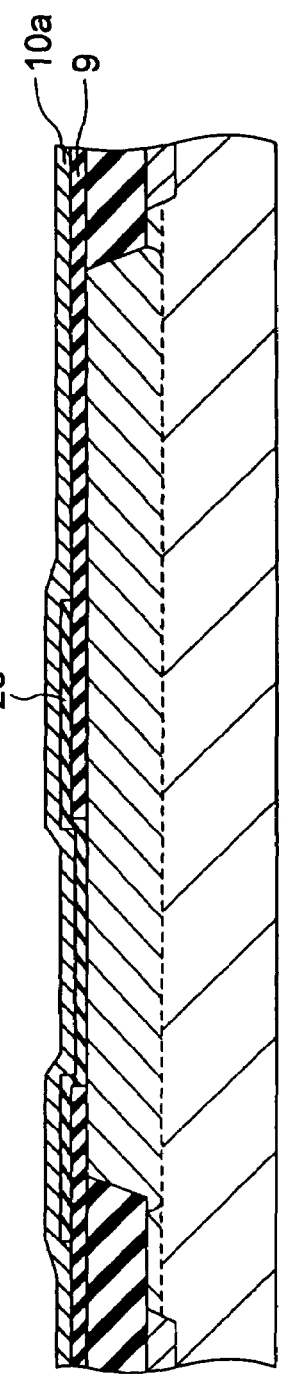

Next, as shown in FIG. 23B, using a photoresist (not shown) as a mask, the silicon nitride film 28a is etched to form the capacitor dielectric layer 28. Further, a polysilicon layer 10a is formed by for example CVD over the entire surface. For example, BF$_2$ is ion-implanted in the polysilicon layer 10a as a p-type impurity under conditions of an ion energy of 20 to 100 keV and a dosage of $1 \times 10^{15}$ to $1 \times 10^{16}$ atoms/cm$^2$.

Figure 23C:
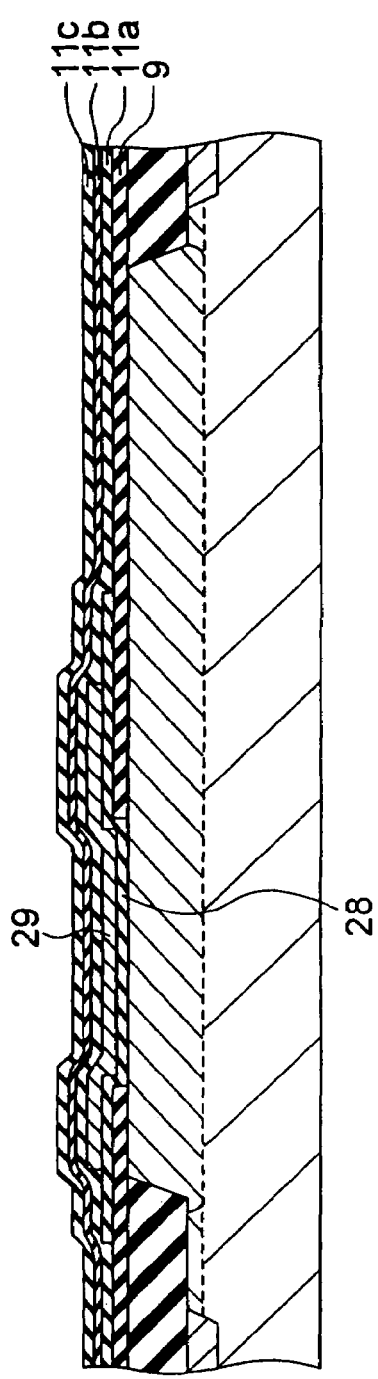

Next, as shown in FIG. 23C, the polysilicon layer 10a is etched to form the upper electrode 29. When the MIS-C of the present embodiment is mounted mixed on the same substrate with the V-npn of the first embodiment, it is possible to form the p-type base electrode 10 of the V-npn and the upper electrode 29 of the MIS-C simultaneously.

Also, when the MIS-C of the present embodiment is mounted mixed on the same substrate with the L-pnp of the second embodiment, it is possible to form the emitter take-out electrode 18 and collector take-out electrode 19 of the L-pnp and the upper electrode 29 of the MIS-C simultaneously.

Also, when the MIS-C of the present embodiment is mounted mixed on the same substrate with the V-pnp of the third embodiment or the S-pnp of the fourth embodiment, it is possible to form the emitter take-out electrode 25 and collector take-out electrode 26 of the V-pnp or S-pnp and the upper electrode 29 of the MIS-C simultaneously.

Next, as shown in FIG. 23C, an NSG film 11a, PSG film 11b, and NSG film 11c are sequentially stacked over the entire surface. The thickness of the NSG film 11a is set at for example 100 nm, that of the PSG film 11b is set at 50 nm, and that of the NSG film 11c is set at 250 nm. The NSG/PSG/NSG stacked films 11a, 11b, 11c can be formed by for example three different CVD steps or a CVD process wherein the amount of supply of phosphorus is changed during the process.

Also, even when the PSG film 11b is changed to a BPSG film, it is possible to prevent autodoping due to its similar gettering ability.

After this, RIE is performed on the NSG/PSG/NSG stacked films 11a, 11b, 11c on the upper electrode 29 and lower electrode layer take-out part to form openings. By forming the interconnections 30 comprising for example a barrier metal layer and metal layer at the openings in the same way as the first embodiment, the semiconductor device shown in FIG. 21A is obtained.

(Sixth Embodiment)

Figure 24A:
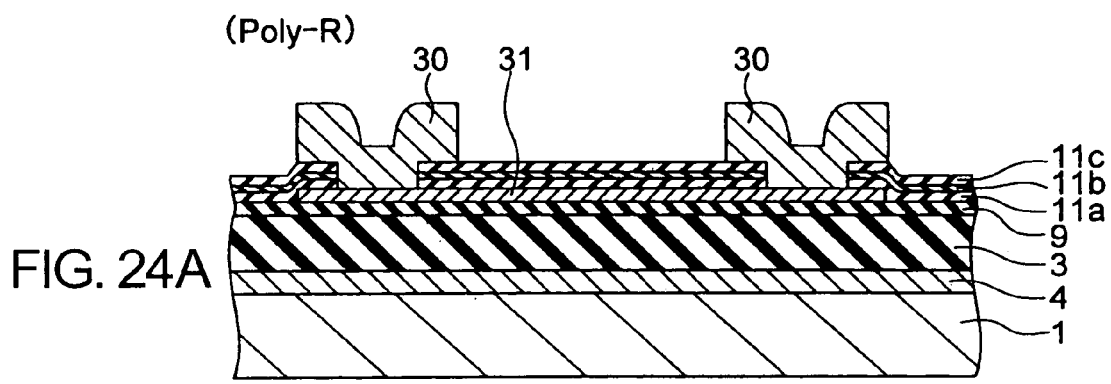

FIG. 24A is a cross-sectional view of a semiconductor device of the present embodiment and shows a polysilicon resistor (Poly-R). As shown in FIG. 24A, the Poly-R is formed on the p-type semiconductor substrate 1 at a LOCOS 3 part. Below the LOCOS 3 is formed an element separating diffusion layer 4 containing a p-type impurity. The element separating diffusion layer 4 reaches the p-type semiconductor substrate 1.

A polysilicon resistor layer 31 is formed on the LOCOS 3 via the silicon oxide film 9. The polysilicon resistor layer 31 contains an n-type impurity. The polysilicon resistor layer 31 is covered with a stacked film of an NSG film 11a, PSG film 11b, and NSG film 11c. In the NSG/PSG/NSG stacked films 11a, 11b, 11c on the polysilicon resistor layer 31 are formed openings wherein interconnections 30 connected to the polysilicon resistor layer 31 are formed.

Next, a process of production of the above semiconductor device of the present embodiment will be explained.

Figure 24B:
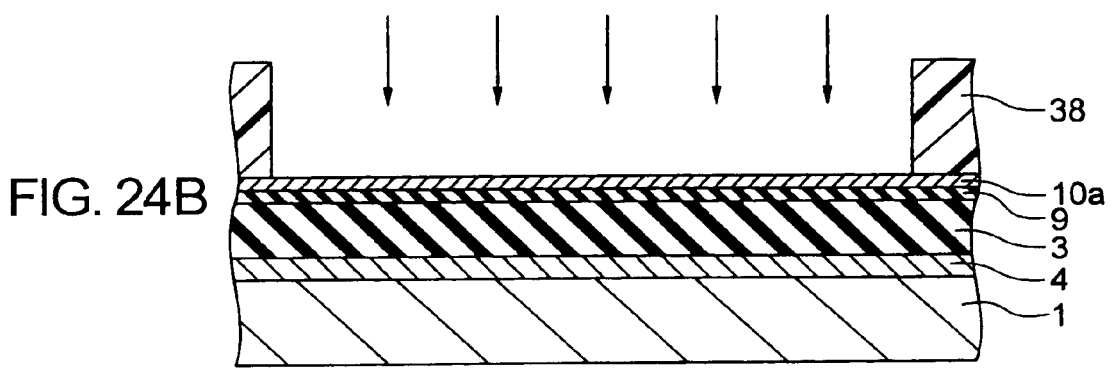
FIG. 24B and FIG. 24C are cross-sectional views of steps of the process of production of a semiconductor device of the sixth embodiment of the present invention.

First, as shown in FIG. 24B, the n-type epitaxial layer 2 is formed on the p-type semiconductor substrate 1 and the LOCOS 3 is formed on the surface of the n-type epitaxial layer 2. Further, the element separating diffusion layer 4 is formed below the LOCOS 3. Next, the silicon oxide film 9 is formed by CVD over the entire surface to a thickness of about 50 to 200 nm. After this, a polysilicon layer 10a is formed by for example CVD over the entire surface. It is possible to form these parts in the same way as the first embodiment.

A photoresist 38 having an opening at a polysilicon resistor forming region is formed. Using the photoresist 38 as a mask, for example phosphorus is ion-implanted in the polysilicon layer 10a. After this, the photoresist 38 is removed.

Figure 24C:
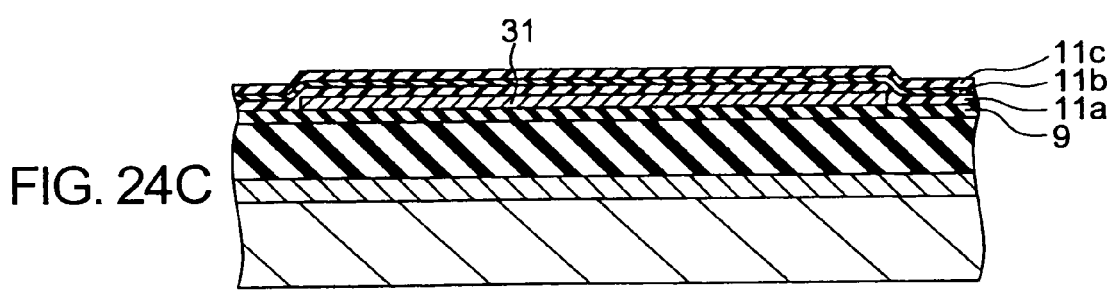

Next, as shown in FIG. 24C, the polysilicon layer 10a is etched to form the polysilicon resistor layer 31.

Next, an NSG film 11a, PSG film 11b, and NSG film 11c are sequentially stacked over the entire surface. The thickness of the NSG film 11a is set at for example 100 nm, that of the PSG film 11b is set at 50 nm, and that of the NSG film 11c is set at 250 nm. The NSG/PSG/NSG stacked films 11a, 11b, 11c can be formed by for example three different CVD steps or a CVD process wherein the amount of supply of phosphorus is changed during the process.

Also, even when the PSG film 11b is changed to a BPSG film, it is possible to prevent autodoping due to its similar gettering ability.

After this, the NSG/PSG/NSG stacked films 11a, 11b, 11c are etched to form openings. By forming the interconnections 30 comprising for example a barrier metal layer and metal layer at these openings in the same way as the first embodiment, the semiconductor device shown in FIG. 24A is obtained.

According to the process of production of the semiconductor device of the embodiments of the present invention, when etching in the production process of a semiconductor device, the NSG/PSG/NSG stacked films are used as a buffering part against damage and it becomes possible to prevent damage to the element. Also, by forming a PSG film having an ability of impurity gettering, it becomes possible to prevent autodoping of impurity to a polysilicon layer and to form for example a bipolar transistor having a stable shallow junction at a base/emitter junction, a capacitor stable in capacitor characteristics, or a resistor stable in resistance. On the other hand, since the PSG film is formed sandwiched between the NSG films, autodoping from the PSG film is prevented. Therefore, it becomes possible to form a reliable semiconductor device.

Note that the present invention is not limited to the above embodiments and includes modifications within the scope of the claims. For example, it is also possible to form the above NSG/PSG/NSG stacked film on a gate electrode of a field effect transistor.

According to the semiconductor of the present invention, it becomes possible to prevent fluctuation of element characteristics due to autodoping of the impurity.

Also, according to the process of production of a semiconductor device of the present invention, it becomes possible to prevent damage due to etching and autodoping of impurity and to produce a reliable semiconductor device.

What is claimed is:

1. A process of production of a semiconductor device comprising the steps of:
   forming a first insulating film on a semiconductor substrate;
   forming a semiconductor layer on the first insulating film;
   forming a second insulating film comprising a non-doped silicon oxide film on the semiconductor layer;
   forming a third insulating film comprising a silicon oxide film containing at least phosphorus on the second insulating film; and
   forming a fourth insulating film comprising a non-doped silicon oxide film on the third insulating film.

2. A process of production of a semiconductor device as set forth in claim 1, wherein the step of forming the second, third, and fourth insulating films comprises three different chemical vapor deposition (CVD) steps.

3. A process of production of a semiconductor device as set forth in claim 1, wherein the step of forming the second, third, and fourth insulating films comprises a continuous chemical vapor deposition process where a supply amount of phosphorus is changed before and after the step of forming the third insulating film.

4. A process of production of a semiconductor device as set forth in claim 1, further comprising the steps of:
   forming a second conductivity type collector region at the surface layer of the semiconductor substrate of the first conductivity type;
   forming a first conductivity type base region at the surface layer of the second conductivity type collector region;
   forming the first insulating film on the semiconductor substrate and forming a first opening in the first insulating film;
   forming a base electrode comprising the semiconductor layer in the first opening and on the first insulating film around the first opening;
   forming the second, third, and fourth insulating films on the base electrode and the first insulating film around the base electrode;
   forming a second opening in the base electrode and the second, third, and fourth insulating films in the first opening;
   forming an emitter take-out part comprising a second semiconductor layer in the second opening and on the fourth insulating film around the second opening; and
   diffusing an impurity from the emitter take-out part and forming a second conductivity type emitter region at the surface layer of the first conductivity type base region.

5. A process of production of a semiconductor device as set forth in claim 1, further comprising the steps of:
   forming a second conductivity type base region at the surface layer of the semiconductor substrate of the first conductivity type;
   forming the first insulating film on the semiconductor substrate and forming a collector opening and emitter opening in the first insulating film;
   forming the semiconductor layer in the collector opening and emitter opening and on the first insulating film;
   etching the semiconductor layer and forming a collector take-out electrode comprising the semiconductor layer in the collector opening and on the first insulating film around the collector opening;
   forming by the etching an emitter take-out electrode comprising the semiconductor layer in the emitter opening and on the first insulating film around the emitter opening;
   forming the second, third, and fourth insulating films on the collector take-out electrode, emitter take-out electrode, and first insulating film around the emitter take-out electrode and the collector take-out electrode;
   diffusing an impurity from the collector take-out electrode and forming a first conductivity type collector region at the surface layer of the second conductivity type base region;
   diffusing an impurity from the emitter take-out electrode and forming a first conductivity type emitter region at the surface layer of the second conductivity type base region;
   forming a contact hole in the first, second, third, and fourth insulating films on the second conductivity type base region; and
   forming a base electrode at the contact hole.

6. A process of production of a semiconductor device as set forth in claim 1, further comprising the steps of:
   forming a second conductivity type impurity diffusion layer at the surface layer of the semiconductor substrate of the first conductivity type;
   forming a first conductivity type collector region at the surface layer of the second conductivity type impurity diffusion layer;

forming a second conductivity type base region at the surface layer of the first conductivity type collector region;

forming the first insulating film on the semiconductor substrate;

forming a collector opening in the first insulating film on the first conductivity type collector region and forming an emitter opening in the first insulating film on the second conductivity type base region;

forming the semiconductor layer in the collector opening and emitter opening and on the first insulating film;

forming a collector take-out electrode comprising the semiconductor layer in the collector opening and on the first insulating film around the collector opening;

forming an emitter take-out electrode comprising the semiconductor layer in the emitter opening and on the first insulating film around the emitter opening;

forming the second, third, and fourth insulating films on the collector take-out electrode, emitter take-out electrode, and first insulating film around the collector take-out electrode and emitter take-out electrode;

diffusing an impurity from the collector take-out electrode and forming a collector take-out part at the surface layer of the first conductivity type collector region;

diffusing an impurity from the emitter take-out electrode and forming a first conductivity type emitter region at the surface layer of the second conductivity type base region;

forming a contact hole in the first, second, third, and fourth insulating films on the second conductivity type base region; and forming a base electrode at the contact hole.

7. A process of production of a semiconductor device as set forth in claim 1, further comprising the steps of:

forming a first conductivity type collector region in the semiconductor substrate of the first conductivity type;

forming a second conductivity type base region in a part of the semiconductor substrate on the first conductivity type collector region;

forming the first insulating film on the semiconductor substrate;

forming a collector opening in the first insulating film on the first conductivity type collector region and forming an emitter opening in the first insulating film on the second conductivity type base region;

forming the semiconductor layer in the collector opening and emitter opening and on the first insulating film;

forming a collector take-out electrode comprising the semiconductor layer in the collector opening and on the first insulating film around the collector opening;

forming an emitter take-out electrode comprising the semiconductor layer in the emitter opening and on the first insulating film around the emitter opening;

forming the second, third, and fourth insulating films on the collector take-out electrode, emitter take-out electrode, and first insulating film around the collector take-out electrode and emitter take-out electrode;

diffusing an impurity from the collector take-out electrode to form a collector take-out part at the surface layer of the first conductivity type collector region;

diffusing an impurity from the emitter take-out electrode to form a first conductivity type emitter region at the surface layer of the second conductivity type base region;

forming a contact hole in the first, second, third, and fourth insulating films on the second conductivity type base region; and forming a base electrode at the contact hole.

8. A process of production of a semiconductor device as set forth in claim 1, further comprising the steps of:

forming a lower electrode layer at the surface layer of the semiconductor substrate;

forming the first insulating film on the semiconductor substrate and forming an opening in the first insulating film on the lower electrode layer;

forming a capacitor dielectric layer in the opening and on the first insulating film around the opening;

forming an upper electrode comprising the semiconductor layer on the capacitor dielectric layer;

forming the second, third, and fourth insulating films on the upper electrode and first insulating film around the upper electrode;

forming a contact hole in the second, third, and fourth insulating films on the upper electrode; and forming an interconnection at the contact hole.

9. A process of production of a semiconductor device as set forth in claim 1, further comprising the steps of:

after forming the semiconductor layer on the first insulating film, diffusing an impurity to the semiconductor layer;

etching the semiconductor layer and forming a resistor layer comprising the semiconductor layer;

forming the second, third, and fourth insulating films on the resistor layer and the insulating film around the resistor layer;

forming a contact hole in the second, third, and fourth insulating films on the resistor layer; and forming an interconnection at the contact hole.

* * * * *